United States Patent
Ikebe et al.

(10) Patent No.: US 11,815,806 B2
(45) Date of Patent: Nov. 14, 2023

(54) REFLECTIVE MASK BLANK, REFLECTIVE MASK AND MANUFACTURING METHOD THEREOF, AND SEMICONDUCTOR DEVICE MANUFACTURING METHOD

(71) Applicant: HOYA CORPORATION, Tokyo (JP)

(72) Inventors: Yohei Ikebe, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 17/990,049

(22) Filed: Nov. 18, 2022

(65) Prior Publication Data

US 2023/0168575 A1 Jun. 1, 2023

Related U.S. Application Data

(63) Continuation of application No. 17/056,713, filed as application No. PCT/JP2019/020632 on May 24, 2019, now Pat. No. 11,531,264.

(30) Foreign Application Priority Data

May 25, 2018 (JP) ................................. 2018-100362
Sep. 4, 2018 (JP) ................................. 2018-165247

(51) Int. Cl.
G03F 1/32 (2012.01)
G03F 1/24 (2012.01)
G03F 7/20 (2006.01)

(52) U.S. Cl.
CPC .................. *G03F 1/32* (2013.01); *G03F 1/24* (2013.01); *G03F 7/2004* (2013.01)

(58) Field of Classification Search
USPC .......................................................... 430/5
See application file for complete search history.

(56) References Cited

U.S. PATENT DOCUMENTS

| 9,746,762 | B2 | 8/2017 | Hamamoto et al. |
| 10,394,113 | B2 | 8/2019 | Hamamoto et al. |
| 2003/0039923 | A1 | 2/2003 | Mangat et al. |
| 2005/0084768 | A1 | 4/2005 | Han et al. |
| 2013/0209925 | A1 | 8/2013 | Sasaki et al. |
| 2014/0302429 | A1 | 10/2014 | Shoki et al. |
| 2016/0238924 | A1 | 8/2016 | Burkhardt et al. |
| 2017/0038673 | A1 | 2/2017 | Ikebe et al. |
| 2017/0285458 | A1 | 10/2017 | Shishido et al. |

FOREIGN PATENT DOCUMENTS

| JP | 2004207593 A | 7/2004 |
| JP | 2005516380 A | 6/2005 |
| JP | 2009206287 A | 9/2009 |
| JP | 2010080659 A | 4/2010 |
| JP | 2015122468 A | 7/2015 |
| JP | 2017227936 A | 12/2017 |
| TW | 201719270 A | 6/2017 |

OTHER PUBLICATIONS

U.S. Appl. No. 17/056,713, "Non-Final Office Action", dated Jun. 8, 2022, 8 pages.
U.S. Appl. No. 17/056,713, "Notice of Allowance", dated Aug. 31, 2022, 5 pages.
PCT/JP2019/020632, "International Search Report", dated Nov. 28, 2019, 5 pages.
SG11202011370V, "Invitation to Respond to Written Opinion", dated Apr. 29, 2022, 6 pages.
JP2020520391, "Notice of Reasons for Refusal" with Machine Translation, dated May 23, 2023, 6 pages.
TW108118040, "Office Action", dated Feb. 4, 2023, 7 pages.
SG11202011370V, "Invitation to Respond to Written Opinion", dated Aug. 14, 2023, 7 pages.

*Primary Examiner* — Christopher G Young
(74) *Attorney, Agent, or Firm* — Kilpatrick Townsend & Stockton LLP

(57) ABSTRACT

Provided is a reflective mask blank with which it is possible to further reduce the shadowing effect of a reflective mask, and also possible to form a fine and highly accurate phase-shift pattern. A reflective mask blank having, in the following order on a substrate, a multilayer reflective film and a phase-shift film that shifts the phase of EUV light, said reflective mask blank characterized in that the phase-shift film has a thin film comprising a metal-containing material that contains: ruthenium (Ru); and at least one element from among chromium (Cr), nickel (Ni), (Co), aluminum (Al), silicon (Si), titanium (Ti), vanadium (V), germanium (Ge), niobium (Nb), molybdenum (Mo), tin (Sn), tellurium (Te), hafnium (Hf), tungsten (W), and rhenium (Re).

21 Claims, 2 Drawing Sheets

REFLECTIVE MASK BLANK, REFLECTIVE MASK AND MANUFACTURING METHOD THEREOF, AND SEMICONDUCTOR DEVICE MANUFACTURING METHOD

CROSS-REFERENCE TO RELATED APPLICATIONS

This application is a continuation of U.S. application Ser. No. 17/056,713, filed Nov. 18, 2020, which is the National Stage of International Application No. PCT/JP2019/020632, filed May 24, 2019, which claims priority to Japanese Patent Application No. 2018-100362, filed May 25, 2018, and claims priority to Japanese Patent Application No. 2018-165247, filed Sep. 4, 2018, and the contents of which are incorporated by reference.

TECHNICAL FIELD

The present disclosure relates to a reflective mask blank and a reflective mask serving as master plates for manufacturing exposure masks used for manufacturing semiconductor devices and the like, and manufacturing methods of the reflective mask blank and the reflective mask, and a manufacturing method of a semiconductor device.

BACKGROUND ART

The types of light sources of exposure apparatuses in the manufacture of semiconductor devices have been evolving while gradually shortening the wavelength as g-line having a wavelength of 436 nm, i-line having a wavelength of 365 nm, a KrF laser having a wavelength of 248 nm and an ArF laser having a wavelength 193 nm. In order to realize a finer pattern transfer, EUV lithography using extreme ultraviolet (EUV: Extreme Ultra Violet) with a wavelength in the vicinity of 13.5 nm has been developed. In EUV lithography, a reflective mask is used because there are few materials transparent to EUV light. A mask structure in which a multilayer reflective film for reflecting exposure light is formed on a low thermal expansion substrate, and a desired transfer pattern is formed on a protective film for protecting the multilayer reflective film is employed as a basic structure of this reflective mask. In addition, based on the configuration of the transfer pattern, typical examples of reflective masks are a binary type reflective mask and a phase shift type reflective mask (a half tone phase shift type reflective mask). The binary type reflective mask has a relatively thick absorber pattern that adequately absorbs EUV light. The phase shift type reflective mask has a relatively thin absorber pattern (a phase shift pattern) which attenuates EUV light by light absorption, and generates reflected light in which the phase is nearly completely inverted (phase inversion of about 180 degrees) relative to light reflected from the multilayer reflective film. The phase shift type reflective masks allow the obtaining of high transferred optical image contrast due to the phase shift effect in the same manner as transmissive optical phase shift masks, thereby making it possible to improve resolution. In addition, a highly accurate, fine phase shift pattern can be formed due to the thin film thickness of the absorber pattern (phase shift pattern) of the phase shift reflective mask.

In EUV lithography, a projection optical system comprising a large number of reflecting mirrors is used because of its light transmittance. EUV light enters a reflective mask on an angle and to prevent these multiple reflecting mirrors from blocking the projected light (exposure light). It is currently common to use an angle of 6 degrees for the incident angle relative to the perpendicular plane of the reflective mask substrate. Studies are proceeding in the direction of using a more oblique angle of about 8 degrees with improving the numerical aperture (NA) of projection optical system.

EUV lithography has a unique problem referred to as shadowing effect as a result of exposure light entering on an angle. The shadowing effect is a phenomenon in which exposure light obliquely enters an absorber pattern having a three-dimensional structure to form a shadow whereby the size and the position of the pattern to be transferred and formed are changed. The three-dimensional structure of the absorber pattern serves as a wall to form a shadow on the shade side whereby the size and the position of the pattern to be transferred and formed are changed. For example, differences occur in the dimensions and location of two transfer patterns resulting in a decrease in transfer accuracy between the case of the orientation of the arranged absorber pattern being parallel to the direction of oblique incident light and the case of the orientation of the arranged absorber pattern being perpendicular.

Technologies related to such a reflective mask for EUV lithography and a mask blank for manufacturing the same are disclosed in Patent Document 1 to Patent Document 3. In addition, in Patent Document 1, the shadowing effect is also disclosed. Decreases in transfer accuracy caused by the shadowing effect have been attempted to be suppressed by making the film thickness of a phase shift pattern comparatively thinner than the case of a binary reflective mask by using a phase shift reflective mask as a reflective mask for EUV lithography.

PRIOR ART DOCUMENTS

Patent Documents

Patent Document 1: JP 2010-080659A
Patent Document 2: JP 2004-207593A
Patent Document 3: JP 2009-206287A

DISCLOSURE OF THE INVENTION

The electrical characteristics and performance of the semiconductor device improve as the finer the pattern and the higher the accuracy of the pattern size and the pattern position, and the degree of integration can be improved and the chip size can be reduced. Consequently, EUV lithography requires an even higher level of high-precision, fine-dimension pattern transfer performance compared to the prior art. At present, it has been required to form an ultrafine highly accurate pattern corresponding to hp 16 nm (half pitch 16 nm) generation. In order to satisfy this requirement, even greater reductions in thickness are required in order to reduce shadowing effects. In the case of EUV exposure in particular, it is necessary to reduce film thickness of the absorber film (phase shift film) to less than 60 nm and preferably to 50 nm or less.

As disclosed in Patent Documents 1 to 3, Ta has been conventionally used as a material for forming an absorber film (phase shift film) of a reflective mask blank. However, the refractive index n of Ta of EUV light (for example, wavelength 13.5 nm) is about 0.943. Therefore, even if the phase shift effect of Ta is used, there is a limit of the lower limit 60 nm for the thickness of the absorber film (phase shift film) made of Ta alone. In order to reduce thickness even further, for example, a metal material having a small refractive index n (having a large phase shift effect) can be used. As a metal material having a small refractive index n at a wavelength of 13.5 nm, there are Mo (n=0.921) and Ru (n=0.887) as disclosed in FIG. 7, for example, of Patent Document 1. However, Mo is very likely to be oxidized, and there is a concern of cleaning resistance, and Ru has a low etching rate and is difficult to be processed and to make modification.

In view of the above-described points, an aspect of the present disclosure is to provide a reflective mask blank that can reduce the shadowing effect of the reflective mask more, and is capable of forming a phase shift pattern with fine and high precision, to provide a reflective mask manufactured thereby, and to provide a semiconductor device manufacturing method.

In order to solve the above-described problems, the present disclosure has following configurations.

(Configuration 1)

Configuration 1 of the present disclosure is a reflective mask blank comprising a multilayer reflective film and a phase shift film for shifting a phase of EUV light on a substrate in this order, wherein the phase shift film has a thin film of a material comprising metals containing ruthenium (Ru) and at least one or more elements of chromium (Cr), nickel (Ni), cobalt (Co), aluminum (Al), silicon (Si), titanium (Ti), vanadium (V), germanium (Ge), niobium (Nb), molybdenum (Mo), tin (Sn), tellurium (Te), hafnium (Hf), tungsten (W) and rhenium (Re).

According to configuration 1 of the present disclosure, a phase shift film having a thin film thickness that is necessary for obtaining a predetermined phase difference of the reflected light from the phase shift pattern compared with the reflected light from an opening portion of the reflective mask pattern can be obtained. Therefore, the shadowing effect caused by the phase shift pattern can be reduced more in the reflective mask. Also, according to configuration 1 of the present disclosure, a phase shift film having a high relative reflectance (a relative reflectance when EUV light reflected at a portion without a phase shift pattern is assumed to be a reflectance of 100%) can be obtained. As a result, throughput at the time of manufacturing a semiconductor device can be improved by using the reflective mask manufactured from the reflective mask blank of configuration 1 of the present disclosure.

(Configuration 2)

Configuration 2 of the present disclosure is the reflective mask blank of configuration 1, wherein a crystal structure of the phase shift film is amorphous.

According to configuration 2 of the present disclosure, because the crystal structure of the material constituting the phase shift film is amorphous, it is possible to reduce the adverse effect of the crystal particles such as metal and the like when forming the phase shift pattern.

(Configuration 3)

Configuration 3 of the present disclosure is the reflective mask blank described in configuration 1 or 2, wherein the phase shift film is a thin film of a material comprising metals containing ruthenium (Ru) and at least one or more elements of chromium (Cr), nickel (Ni) and cobalt (Co).

According to configuration 3 of the present disclosure, because the etching rate with the dry etching gas at the time of patterning the above-described the phase shift film can be made faster, it is possible to make the thickness of the resist film thin, which is advantageous for forming a fine pattern of the phase shift film.

(Configuration 4)

Configuration 4 of the present disclosure is the reflective mask blank of configuration 3, wherein a composition ratio of the Ru and the Cr (Ru:Cr) is 15:1 to 1:20.

According to configuration 4 of the present disclosure, because the metal used together with Ru is Cr that can be etched by the same etching gas as that of Ru, and the composition ratio of Ru and Cr is within the predetermined range, a phase shift film having good processing characteristics and capable of obtaining a predetermined phase difference in a thin film thickness can be obtained.

(Configuration 5)

Configuration 5 of the present disclosure is the reflective mask blank of configuration 3, wherein a composition ratio of the Ru and the Ni (Ru:Ni) is 20:1 to 1:4.

According to configuration 5 of the present disclosure, because the metal used together with Ru is Ni having a large extinction coefficient, and the composition ratio of Ru and Ni is within the predetermined range, a phase shift film with a thin film thickness having a high reflectance and capable of obtaining a predetermined phase difference can be obtained.

(Configuration 6)

Configuration 6 of the present disclosure is the reflective mask blank of configuration 3, wherein a composition ratio of the Ru and the Co (Ru:Co) is 20:1 to 1:5.

According to configuration 6 of the present disclosure, because the metal used together with Ru is Co having a large extinction coefficient, and the composition ratio of Ru and Co is within the predetermined range, a phase shift film with a thin film thickness having a high reflectance and capable of obtaining a predetermined phase difference can be obtained.

(Configuration 7)

Configuration 7 of the present disclosure is the reflective mask blank of any one of configurations 1 to 6, further comprising a protective film between the multilayer reflective film and the phase shift film, wherein the protective film is made of a material containing silicon (Si) and oxygen (O).

According to configuration 7 of the present disclosure, because the protective film is formed on the multilayer reflective film, damage to the surface of the multilayer reflective film at the time of manufacturing a reflective mask (EUV mask) using a substrate with a multilayer reflective film can be suppressed so that reflectance characteristics to EUV light become good. Because the protective film comprises a material containing silicon (Si) and oxygen (O), it has resistance to a dry etching gas for patterning the phase shift film so that the protective film is not etched, and damage to the protective film can be suppressed.

(Configuration 8)

Configuration 8 of the present disclosure is a reflective mask comprising a phase shift pattern obtained by patterning the phase shift film in the reflective mask blank according to any one of configurations 1 to 7.

According to configuration 8 of the present disclosure, a reflective mask (EUV mask) of the present disclosure can be manufactured by patterning the phase shift film of the reflective mask blank, since the phase shift pattern of the reflective mask absorbs EUV light, and part of the EUV light can be reflected with a predetermined phase difference from an opening portion (the portion where no phase shift pattern is formed).

(Configuration 9)

Configuration 9 of the present disclosure is a method of manufacturing a reflective mask in which a phase shift pattern is formed by patterning the phase shift film of the reflective mask blank according to any one of configurations 1 to 7 by a dry etching gas comprising a chlorine-based gas and an oxygen gas.

According to configuration 9 of the present disclosure, a reflective mask that can make the thickness of the phase shift film thin and can reduce the shadowing effect, can be manufactured, and a fine and highly accurate phase shift pattern with a stable cross-sectional shape having small side wall roughness can be formed.

(Configuration 10)

Configuration 10 of the present disclosure is a method of manufacturing a semiconductor device, the method comprising placing the reflective mask according to configuration 8 in an exposure apparatus comprising an exposure light source that emits EUV light, and transferring a transfer pattern to a resist film formed on a transferred substrate.

According to the method of manufacturing the semiconductor device of configuration 10 of the present disclosure, a reflective mask that can make the thickness of the phase shift film thin and can reduce the shadowing effect, can be used for manufacturing the semiconductor device. Therefore, a semiconductor device having a fine and highly accurate transfer pattern can be manufactured.

According to the reflective mask blank (the reflective mask manufactured thereby) of the present disclosure, a fine and highly accurate phase shift pattern that can make the thickness of the phase shift film thin and can reduce the shadowing effect can be formed with a stable cross-sectional shape having small side wall roughness. Therefore, the reflective mask manufactured by using the reflective mask blank having this structure can form a phase shift pattern itself formed on the mask with fine and highly accurate and also can prevent from lowering in accuracy at the time of transfer due to shadowing. In addition, by performing EUV lithography using this reflective mask, it is possible to provide a manufacturing method of a fine and highly accurate semiconductor device.

MODE FOR CARRYING OUT THE DISCLOSURE

Figure 1:
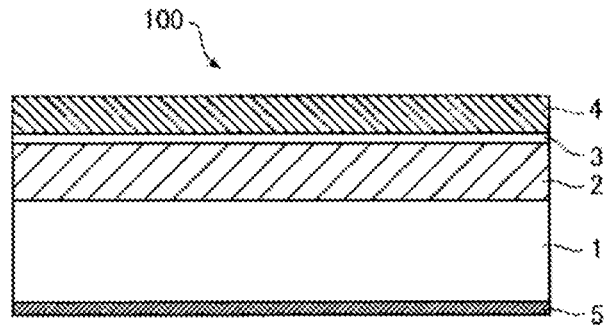
FIG. 1 is a schematic cross-sectional view of a main part for explaining a schematic configuration of a reflective mask blank of the present disclosure.

Hereinafter, an embodiment of the present disclosure will be described in detail with reference to the drawings. The following embodiment is a mode for embodying the present disclosure, and does not limit the present disclosure to the scope thereof. In the drawings, the same or corresponding parts are designated by the same reference numerals, and the description thereof may be sometimes simplified or omitted.

<Configuration of Reflective Mask Blank 100 and Manufacturing Method Thereof>

FIG. 1 is a schematic cross-sectional view of a main part for explaining the configuration of the reflective mask blank 100 of the present embodiment. As illustrated in FIG. 1, a reflective mask blank 100 has a mask blank substrate 1 (simply also referred to as "substrate 1".), a multilayer reflective film 2, a protective film 3 and a phase shift film 4, and these are built up in this order. The multilayer reflective film 2 formed on the first main surface (front surface) side reflects EUV light that is exposure light. The protective film 3 is provided to protect the multilayer reflective film 2, and is formed of a material having resistance to an etchant and a cleaning liquid used when patterning the phase shift film 4 described later. The phase shift film 4 absorbs EUV light. Also, a back side conductive film 5 for an electrostatic chuck is formed on the second main surface (back surface) side of the substrate 1.

In the present specification, "having the multilayer reflective film 2 on the main surface of the mask blank substrate 1" means the case where the multilayer reflective film 2 is arranged in contact with the surface of the mask blank substrate 1, and in addition thereto, the case where another film is present between the mask blank substrate 1 and the multilayer reflective film 2 is included. The same applies to other films. For example, "having the film B on the film A" means that the film A and the film B are arranged so as to be in direct contact with each other, and also includes that other film(s) is/are present between the film A and the film B. In addition, in the present specification, for example, "the film A is arranged in contact with the surface of the film B" means that the film A and the film B are arranged in direct contact with each other without interposing another film(s) between the film A and the film B.

In the present specification, the phase shift film 4 is, for example, "a thin film of a material comprising metals comprising ruthenium (Ru) and a metal including chromium (Cr)" means that the phase shift film 4 is a thin film constituted by, at least, substantially a material comprising ruthenium (Ru) and chromium (Cr). On the other hand, the phase shift film 4 is "a thin film of ruthenium (Ru) and chromium (Cr)" sometimes means that the phase shift film 4 consists of ruthenium (Ru) and chromium (Cr). Also, in any case, these include that inevitably migrated impurities are contained in the phase shift film 4.

Hereinafter, the respective layers are each described.

<<Substrate 1>>

The substrate 1 preferably used is a material having a low thermal expansion coefficient within the range of 0±5 ppb/° C. in order to prevent distortion of the phase shift pattern 4a due to heat during exposure by EUV light. As a material having a low thermal expansion coefficient within this range, for example, $SiO_2$—$TiO_2$-based glass, multi-component-based glass ceramics, and the like can be used.

The first main surface of the substrate 1 at the side on which a transfer pattern (the phase shift film 4 described later constitutes this) is to be formed is surface-treated so as to be high flatness from the viewpoints of obtaining at least pattern transfer accuracy and position accuracy. In the case of EUV exposure, the flatness is preferably 0.1 μm or less, further preferably 0.05 μm or less, and particularly preferably 0.03 μm or less in a region of 132 mm×132 mm of the main surface at the side on which a transfer pattern of the substrate 1 is to be formed. Also, the second main surface at the opposite side to the side on which the transfer pattern is to be formed is a surface to be electrostatically chucked when it is set in an exposure device, and the flatness is preferably 0.1 μm or less, further preferably 0.05 μm or less, and particularly preferably 0.03 μm or less in a region of 132 mm×132 mm. The flatness on the second main surface side of the reflective mask blank 100 is preferably a flatness of 1 μm or less, further preferably 0.5 μm or less, and particularly preferably 0.3 μm or less in a region of 142 mm×142 mm.

In addition, height of the surface smoothness of the substrate 1 is also extremely important parameter. The surface roughness of the first main surface of the substrate 1 on which the phase shift pattern 4a for transfer is to be formed preferably has a root mean square roughness (RMS) of 0.1 nm or less. The surface roughness can be measured by an atomic force microscope.

Further, the substrate 1 preferably has high rigidity to prevent deformation caused by film stress of a film (such as the multilayer reflective film 2 and the like) formed thereon. In particular, the substrate 1 preferably has a high Young's modulus of 65 GPa or more.

<<Multilayer Reflective Film 2>>

The multilayer reflective film 2 imparts a function that reflects EUV light in a reflective mask, and the multilayer reflective film 2 has the configuration of a multilayer film in which each layer composed mainly of elements having different refractive indices is cyclically layered.

In general, a multilayer film obtained by alternately layered roughly 40 to 60 cycles of a thin film of high refractive index material in the form of a light element or compound thereof (high refractive index layer) and a thin film of a low refractive index material in the form of a heavy element or compound thereof (low refractive index layer) is used for the multilayer reflective film 2. The multilayer film may be obtained by building up a high refractive index layer and low refractive index layer in that order starting from the side of the substrate 1 for a plurality of cycles, with one cycle consisting of a stack of a high refractive index layer/low refractive index layer. Alternatively, the multilayer film may be obtained by building up a low refractive index layer and high refractive index layer in that order starting from the side of the substrate 1 for a plurality of cycles, with one cycle consisting of a stack of low refractive index layer/high refractive index layer. Furthermore, the layer on the uppermost side of the multilayer reflective film 2, namely the front surface layer of the multilayer reflective film 2 on the opposite side from the substrate 1, is preferably a high refractive index layer. In the multilayer film described above, in a case where a stack of the high refractive index layer and the low refractive index layer, in which a high refractive index layer and a low refractive index layer are layered in this order on the substrate 1 is counted as one period, and stacks are built up for a plurality of periods, the outermost layer is a low refractive index layer. In this case, when the low refractive index layer constitutes the outermost surface of the multilayer reflective film 2, it is easily oxidized and the reflectance of the reflective mask 200 decreases. Therefore, it is preferable to further form a high refractive index layer on a low refractive index layer of the outermost layer to form the multilayer reflective film 2. On the other hand, in the multilayer film described above, in a case where a stack of the low refractive index layer and the high refractive index layer in which a low refractive index layer and a high refractive index layer are layered in this order on the substrate 1 is counted as one period and stacks are built up for a plurality of periods, the outermost layer is a high refractive index layer, so that it may be used as it is.

In the present embodiment, a layer containing silicon (Si) is employed as the high refractive index layer. In addition to Si alone, a Si compound containing Si and boron (B), carbon (C), nitrogen (N) and oxygen (O) can be used as a material containing Si. A reflective mask 200 for EUV lithography excellent in reflectance of EUV light can be obtained by using the layer containing Si as a high refractive index layer. In addition, in the present embodiment, a glass substrate is preferably used as the substrate 1. Si also has excellent adhesion to the glass substrate. In addition, metal alone selected from molybdenum (Mo), ruthenium (Ru), rhodium (Rh) and platinum (Pt), or an alloy thereof is used as a low refractive index layer. For example, a Mo/Si periodic layered film in which Mo films and Si films are alternately layered for about 40 to 60 periods is preferably used as the multilayer reflective film 2 for EUV light having a wavelength of 13 nm to 14 nm. The high refractive index layer that is the outermost layer of the multilayer reflective film 2 may be formed by silicon (Si).

The reflectance of the multilayer reflective film 2 alone is usually 65% or more, and the upper limit thereof is usually 73%. The thickness and period of each constituent layer of the multilayer reflective film 2 can be appropriately selected in accordance with the exposure wavelength so as to satisfy Bragg's law of reflection. The multilayer reflective film 2 includes a plurality of high refractive index layers and a plurality of low refractive index layers, and the plurality of high refractive index layers do not have to have the same thickness and the plurality of low refractive index layers do not have to have the same thickness. Further, the film thickness of the Si layer of the outermost surface of the multilayer reflective film 2 can be adjusted within a range that does not reduce the reflectance. The film thickness of the outermost surface Si (high refractive index layer) can be in the range of 3 nm to 10 nm.

Methods for forming the multilayer reflective film 2 are known in the art. For example, the multilayer reflective film 2 can be formed by forming each layer with ion beam sputtering. In the case of the above-described Mo/Si periodic multilayer film, for example, first, a Si film having a thickness of about 4 nm is formed on the substrate 1 by ion beam sputtering with a Si target. Thereafter, a Mo film having a thickness of about 3 nm is formed with a Mo target. With the Si film and the Mo film counted as one period, Si films and Mo films are layered for 40 to 60 periods to form the multilayer reflective film 2 (the layer of the outermost surface is a Si layer). In addition, when the multilayer reflective film 2 is formed, it is preferable to form the multilayer reflective film 2 by supplying krypton (Kr) ion particles from an ion source and performing ion beam sputtering.

<<Protective Film 3>>

The protective film 3 can be formed on the multilayer reflective film 2 or formed in contact with the surface of the multilayer reflective film 2 in order to protect the multilayer reflective film 2 from dry etching and cleaning in the manufacturing process of the reflective mask 200 to be described later. In addition, it also serves to protect the multilayer reflective film 2 when the black defect of the phase shift pattern 4a is corrected using the electron beam (EB). Here, in FIG. 1, the case where the protective film 3 is one layer is illustrated, but it can be a stack of three or more layers. The protective film 3 is formed of a material that has resistance to an etchant used at the time of patterning the phase shift film 4 and a cleaning liquid. Damage to the surface of the multilayer reflective film 2 at the time of manufacturing the reflective mask 200 (EUV mask) using a substrate with the multilayer reflective film can be suppressed by the protective film 3 formed on the multilayer reflective film 2. Therefore, reflectance characteristics of the multilayer reflective film 2 to EUV light becomes good.

In the following, the case where the protective film 3 and the phase shift film 4 are one layer each will be described as an example. When the protective film 3 contains a plural number of layers, the property of the material of the outermost layer (the layer in contact with the phase shift film 4)

of the protective film 3 becomes important in relation to the phase shift film 4. Also, when the phase shift film 4 contains a plural number of layers, the property of the material of the lowermost layer (the layer in contact with the protective film 3) of the phase shift film 4 becomes important in relation to (the outermost layer of) the protective film 3.

In the reflective mask blank 100 of the present embodiment, as a material for the protective film 3, a material that is resistant to the etching gas to be used for dry etching for patterning the phase shift film 4 formed on the protective film 3 can be selected.

For example, when the layer of the phase shift film 4 in contact with the surface of the protective film 3 is a thin film of a material (predetermined Ru-based material) comprising metals comprising ruthenium (Ru) and at least one or more elements of chromium (Cr), nickel (Ni), cobalt (Co), aluminum (Al), silicon (Si), titanium (Ti), vanadium (V), germanium (Ge), niobium (Nb), molybdenum (Mo), tin (Sn), tellurium (Te), hafnium (Hf), tungsten (W) and rhenium (Re), the material that can be used as the protective film 3 is a material selected from a silicon-based material such as silicon (Si), a material containing silicon (Si) and oxygen (O), a material containing silicon (Si) and nitrogen (N) and the like, and, a chromium-based material such as chromium (Cr), and a material containing chromium (Cr) and at least one or more elements of oxygen (O), nitrogen (N) and carbon (C).

For example, when the layer of the phase shift film 4 in contact with the surface of the protective film 3 is a thin film of a material (predetermined Ru-based material) comprising metals comprising ruthenium (Ru) and at least one or more elements of aluminum (Al), silicon (Si), titanium (Ti), niobium (Nb), molybdenum (Mo), tin (Sn), tellurium (Te), hafnium (Hf), tungsten (W) and rhenium (Re), a dry etching gas that can be used at the time of patterning the phase shift film 4 is a fluorine-based gas, and the above-described chromium-based material can be selected as the material of the protective film 3.

For example, when the layer of the phase shift film 4 in contact with the surface of the protective film 3 is a thin film of a material (predetermined Ru-based material) comprising metals comprising ruthenium (Ru) and at least one or more elements of aluminum (Al), silicon (Si), titanium (Ti), germanium (Ge), tin (Sn) and hafnium (Hf), a dry etching gas that can be used at the time of patterning the phase shift film 4 is a fluorine-based gas or a chlorine-based gas containing no oxygen. In such a case, the above-described silicon-based material and the above-described chromium-based material can be selected as a material of the protective layer 3.

For example, when the layer of the phase shift film 4 in contact with the surface of the protective film 3 is a thin film of a material (predetermined Ru-based material) comprising metals comprising ruthenium (Ru) and at least one or more elements of chromium (Cr), nickel (Ni) and cobalt (Co), or, a material (predetermined Ru-based material) comprising metals comprising ruthenium (Ru) and at least one or more elements of vanadium (V), niobium (Nb), molybdenum (Mo), tungsten (W) and rhenium (Re), a dry etching gas that can be used at the time of patterning the phase shift film 4 is a chlorine-based gas containing oxygen. In such a case, silicon (Si), a silicon-based material such as a material containing silicon (Si) and oxygen (O) or a material containing silicon (Si) and nitrogen (N), or the like can be selected as a material of the protective film 3. In addition, when the phase shift film 4 is made of a plurality of layers, and when the layer of the phase shift film 4 in contact with the surface of the protective film 3 is a thin film of a material other than the predetermined Ru-based material, a material of the protective film 3 can be selected depending on the etching characteristics of the material.

The protective film 3 of the reflective mask blank 100 of the present embodiment is preferably made of silicon (Si), or a material containing silicon (Si) and oxygen (O) (silicon-based material). The phase shift film 4 made of a material (predetermined Ru-based material) comprising metals comprising ruthenium (Ru) and at least one or more elements of chromium (Cr), nickel (Ni) and cobalt (Co), and a material (predetermined ruthenium (Ru)-based material) comprising metals comprising ruthenium (Ru) and at least one or more elements of vanadium (V), niobium (Nb), molybdenum (Mo), tungsten (W) and rhenium (Re) can be etched by dry etching using a chlorine-based gas containing oxygen, or an oxygen gas. The silicon-based material such as silicon (Si), a material containing silicon (Si) and oxygen (O), or a material containing silicon (Si) and nitrogen (N) or the like has resistance to these dry etching gases, and the higher the oxygen content gives the greater the resistance. Therefore, the material of the protective film 3 is more preferably silicon oxide ($SiO_x$, $1 \leq x \leq 2$), further preferably x is larger, and particularly preferably $SiO_2$.

In the case of EUV lithography, because there are few substances transparent to exposure light, EUV pellicles for preventing foreign matter from adhering to a mask pattern surface are not technically easy. For this reason, pellicleless operation which does not use pellicles has become the mainstream. In EUV lithography, exposure contamination, such as deposition of a carbon film on a mask or growth of an oxide film, occurs by EUV exposure. Therefore, when the EUV reflective mask is used in the manufacture of a semiconductor device, it is necessary to perform cleaning frequently to remove foreign matter and contamination on the mask. For this reason, an order of magnitude higher mask cleaning resistance of the EUV reflective mask is required compared to a transmissive mask for optical lithography. Since the reflective mask 200 has the protective film 3, cleaning resistance to the cleaning liquid can be high.

The thickness of the protective film 3 is not particularly limited as long as the function as the multilayer reflective film 2 can be fulfilled. From the viewpoint of EUV light reflectance, the thickness of the protective film 3 is preferably from 1.0 nm to 8.0 nm, and more preferably from 1.5 nm to 6.0 nm.

A method similar to a film forming method known in the art can be employed as a method for forming the protective film 3 without any particular limitation. Specific examples thereof include sputtering and ion beam sputtering.

<<Phase Shift Film 4>>

A phase shift film 4 for shifting a phase of EUV light is formed on the protective film 3. At the portion where the phase shift film 4 (phase shift pattern 4a) is formed, a part of the light is reflected at a level that does not adversely affect the pattern transfer while absorbing and reducing the EUV light. On the other hand, at an opening portion (the portion where no phase shift film 4 is provided), EUV light is reflected from the multilayer reflective film 2 via the protective film 3. The reflected light from the portion where the phase shift film 4 is formed forms a desired phase difference with the reflected light from the opening portion. The phase shift film 4 is formed so that a phase difference between the reflected light from the phase shift film 4 and the reflected light from the multilayer reflective film 2 is from 160 degrees to 200 degrees. Since the light having inverted phase differences in the vicinity of 180 degrees interfere with each other at the pattern edge portion, the image contrast of the projected optical image is improved. Accompanied with improvement in the image contrast, the resolution is increased and various margins with regard to the exposure such as exposure margin, focus margin exposure and the like are expanded. Although it may vary depending on the pattern and the exposure conditions, in general, a standard of the reflectance of the phase shift film 4 for obtaining the phase shift effect is 2% or more in terms of the relative reflectance. In order to obtain a sufficient phase shift effect, the reflectance of the phase shift film 4 is preferably 6% or more of a relative reflectance. Also, when the relative reflectance is high as 10% or more, and more preferably 15% or more, the phase difference can be set to 130 degrees to 160 degrees, or 200 degrees to 230 degrees in order to improve contrast more. Here, the relative reflectance of the phase shift film 4 (phase shift pattern 4a) is a reflectance of EUV light reflected from the phase shift pattern 4a when the reflectance of EUV light reflected from a multilayer reflective film 2 (including a multilayer reflective film 2 attached with a protective film 3) at a portion without phase shift pattern 4a is assumed to be 100%. In the present specification, the relative reflectance is simply referred to as a "reflectance" in some cases.

Also, in order to obtain a sufficient phase shift effect, the absolute reflectance of the phase shift film 4 is preferably 9% or more. Here, the absolute reflectance of the phase shift film 4 (phase shift pattern 4a) refers to a reflectance (ratio of incident light intensity and reflected light intensity) of EUV light reflected from the phase shift film 4 (or phase shift pattern 4a).

In order to further improve resolution and to improve throughput at the time of manufacturing a semiconductor device, the relative reflectance of the phase shift pattern 4a is preferably 6% to 40%. It has been required to be more preferably 6 to 35%, further preferably 15% to 35%, and further preferably 15% to 25%.

In order to further improve resolution and to improve throughput at the time of manufacturing a semiconductor device, the absolute reflectance of the phase shift film 4 (or phase shift pattern 4a) is desirably 4% to 27%, and more preferably 10% to 17%.

The phase shift film 4 of the present embodiment has a thin film of a material comprising metals comprising ruthenium (Ru) and at least one or more elements of chromium (Cr), nickel (Ni), cobalt (Co), aluminum (Al), silicon (Si), titanium (Ti), vanadium (V), germanium (Ge), niobium (Nb), molybdenum (Mo), tin (Sn), tellurium (Te), hafnium (Hf), tungsten (W) and rhenium (Re).

The phase shift film 4 of a reflective mask blank 100 of the present embodiment can obtain a phase shift pattern 4a having a relative reflectance of 6% to 40% by using a predetermined material(s). The phase shift film 4 of the reflective mask blank 100 of the present embodiment can obtain an absolute reflectance of 4% to 27% by using a predetermined material(s). Also, the phase shift film 4 of the reflective mask blank 100 of the present embodiment has a thin film thickness for obtaining a predetermined phase difference (a phase difference between the reflected light from the opening portion and the reflected light from the phase shift pattern 4a). Therefore, in the reflective mask 200, the shadowing effect caused by the phase shift pattern 4a can be reduced more. Also, a throughput at the time of manufacturing a semiconductor device can be improved by using the reflective mask 200 manufactured using the reflective mask blank 100 of the present embodiment.

The material of the phase shift film 4 of the reflective mask blank 100 (hereinafter, it is simply referred to as "predetermined Ru-based material" in some cases) of the present embodiment will be further described.

The crystal structure of the phase shift film 4 of the reflective mask blank 100 of the present embodiment is preferably amorphous.

The refractive index n of Ru is n=0.886 (the extinction coefficient k=0.017), and it is preferable as a material of the phase shift film 4 having high reflectance. However, a Ru-based compound such as RuO and the like are likely to have a crystallized structure and have poor processing characteristics. That is, the crystal grain of a crystallized metal is likely to have a large sidewall roughness at the time of forming the phase shift pattern 4a. Therefore, it may exert adverse effect at the time of forming the predetermined phase shift pattern 4a. On the other hand, when the crystal structure of the phase shift film 4 is amorphous, adverse effect at the time of forming the phase shift pattern 4a can be reduced. The crystal structure of the phase shift film 4 can be amorphous by adding a predetermined element(s) (X) to Ru, which results in making the etching rate rapid, making the pattern shape good and improve processing characteristics. As the predetermined element(s) (X), at least one or more of Cr, Ni, Co, Al, Si, Ti, V, Ge, Nb, Mo, Sn, Te, Hf, W and Re can be selected.

Incidentally, the refractive index n and the extinction coefficient k of Ni are n=0.948 and k=0.073. Also, Co has n=0.933 and k=0.066, and Cr has n=0.932 and k=0.039. Binary materials (RuCr, RuNi and RuCo) in which a predetermined element(s) (X) is added to Ru are able to reduce the thickness of the phase shift film 4 compared to RuTa that is a conventional material. Also, because Ni and Co have a larger extinction coefficient k than that of Cr, it is possible to make the thickness of the phase shift film 4 thinner by selecting Ni and/or Co as the element (X) rather than selecting Cr.

Further, the refractive index n and the extinction coefficient k of Al are n=1.003 and k=0.03, the refractive index n and the extinction coefficient k of Si are n=0.999 and k=0.002, the refractive index n and the extinction coefficient k of Ti are n=0.952 and k=0.014, the refractive index n and the extinction coefficient k of V are n=0.944 and k=0.025, the refractive index n and the extinction coefficient k of Ge are n=0.995 and k=0.032, the refractive index n and the extinction coefficient k of Nb are n=0.933 and k=0.005, the refractive index n and the extinction coefficient k of Mo are n=0.923 and k=0.007, the refractive index n and the extinction coefficient k of Sn are n=0.941 and k=0.074, the refractive index n and the extinction coefficient k of Te are n=0.973 and k=0.075, the refractive index n and the extinction coefficient k of Hf are n=0.961 and k=0.035, the refractive index n and the extinction coefficient k of W are n=0.933 and k=0.033, and the refractive index n and the extinction coefficient k of Re are n=0.914 and k=0.04.

Also, Sn, Te and Re have a larger extinction coefficient k than that of Cr. Therefore, it is possible to make the thickness of the phase shift film 4 thinner by selecting Sn, Te and Re as the element (X) rather than selecting Cr.

Further, ranges of the refractive index n and the extinction coefficient k when the phase difference of the phase shift film 4 is 160 degrees to 200 degrees are as follows. When the relative reflectance of the phase shift film 4 is 6% to 40% or the absolute reflectance thereof is 4% to 27%, it is preferable that the refractive index n to EUV light of a material in which a predetermined element(s) (X) is added to Ru is 0.860 to 0.950 and the extinction coefficient k is 0.008 to 0.095. When the relative reflectance is 6% to 35% or the absolute reflectance is 4% to 23%, it is preferable that the refractive index n to EUV light of a material in which a predetermined element(s) (X) is added to Ru is 0.880 to 0.950 and the extinction coefficient k is 0.012 to 0.095. When the relative reflectance is 15% to 35% or the absolute reflectance is 10% to 23%, it is preferable that the refractive index n to EUV light of a material in which a predetermined element(s) (X) is added to Ru is 0.880 to 0.950 and the extinction coefficient k is 0.012 to 0.050. When the relative reflectance is 15% to 25% or the absolute reflectance is 10% to 17%, it is preferable that the refractive index n to EUV light of a material in which a predetermined element(s) (X) is added to Ru is 0.890 to 0.950 and the extinction coefficient k is 0.020 to 0.050.

In addition, ranges of the refractive index n and the extinction coefficient k when the phase difference of the phase shift film 4 is 130 degrees to 160 degrees are as follows. When the relative reflectance of the phase shift film 4 is 10% to 40% or the absolute reflectance is 6.7% to 27%, it is preferable that the refractive index n to EUV light of a material in which a predetermined element(s) (X) is/are added to Ru is 0.860 to 0.950 and the extinction coefficient k is 0.009 to 0.095. When the relative reflectance is 15% to 35% or the absolute reflectance is 10% to 23%, it is preferable that the refractive index n to EUV light of a material in which a predetermined element(s) (X) is/are added to Ru is 0.860 to 0.950 and the extinction coefficient k is 0.01 to 0.073.

Further, ranges of the refractive index n and the extinction coefficient k when the phase difference of the phase shift film 4 is 200 degrees to 230 degrees are as follows. When the relative reflectance of the phase shift film 4 is 10% to 40% or the absolute reflectance is 6.7% to 27%, it is preferable that the refractive index n to EUV light of a material in which a predetermined element(s) (X) is added to Ru is 0.860 to 0.940 and the extinction coefficient k is 0.008 to 0.057. When the relative reflectance is 15% to 35% or the absolute reflectance is 10% to 23%, it is preferable that the refractive index n to EUV light of a material in which a predetermined element(s) (X) is added to Ru is 0.860 to 0.939 and the extinction coefficient k is 0.009 to 0.045.

The phase difference and the reflectance of the phase shift film 4 can be adjusted by changing the refractive index n, the extinction coefficient k and the thickness. The thickness of the phase shift film 4 is preferably 60 nm or less, more preferably 50 nm or less and further preferably 40 nm or less. The thickness of the phase shift film 4 is preferably 25 nm or more. When it has a protective film 3, the phase difference and the reflectance of the phase shift film 4 may be adjusted in consideration of the refractive index n, the extinction coefficient k and the thickness of the protective film 3.

The binary materials (RuCr, RuNi and RuCo) in which a predetermined element(s) (X) is/are added to Ru have good processing characteristics as compared with that of RuTa that is a conventional material. When Ta is oxidized, it is difficult to subjecting to etching with a chlorine-based gas and an oxygen gas. In particular, RuCr is excellent in processing characteristics.

The binary materials (RuCr, RuNi and RuCo) in which a predetermined element(s) (X) is/are added to Ru are an amorphous structure, and are capable of easily subjecting to etching with a mixed gas of a chlorine-based gas and an oxygen gas. In addition, these materials are capable of etching with an oxygen gas. It is considered that the same applies to the ternary materials (RuCrNi, RuCrCo and RuNiCo) and a quaternary materials (RuCrNiCo).

Also, in addition to the above-described binary materials, the binary materials in which V, Nb, Mo, W or Re is added to Ru (RuV, RuNb, RuMo, RuW and RuRe) have better workability as compared with RuTa that is a conventional material. Similarly to RuCr, RuW and RuMo are particularly excellent in processing characteristics.

Further, the binary materials (RuV, RuNb, RuMo, RuW and RuRe) in which a predetermined element(s) (X) is/are added to Ru are an amorphous structure, and it is possible to easily subjecting to etching using a mixed gas of a chlorine-based gas and an oxygen gas. Also, these materials can be etched by an oxygen gas. It is considered that the same applies to the ternary materials and the quaternary materials.

Next, a mixing ratio of Ru and a predetermined element(s) (X) will be described with regard to a predetermined Ru-based material that is a material of the phase shift film 4 of the present embodiment.

Figure 3:
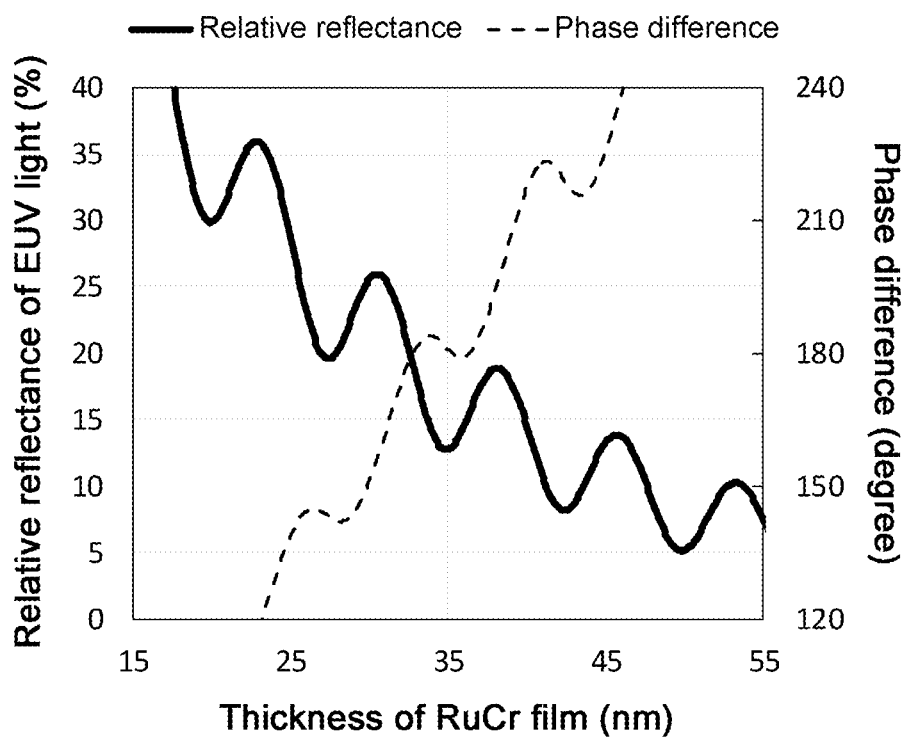
FIG. 3 is a diagram illustrating the relationship between thickness of the phase shift film and relative reflectance and phase difference for light having a wavelength of 13.5 nm.

The relative reflectance and the absolute reflectance of a predetermined Ru-based material increases as the content of Ru increases. Further, the reflected light of the phase shift film 4 is superimposed light of the front-surface-reflected-light from the front surface of the phase shift film 4 and the back-surface-reflected-light at the back surface (interface between the phase shift film 4 and the protective film 3 or the multilayer reflective film 2) of the phase shift film 4 transmitting through the phase shift film 4. Therefore, the intensity of the reflected light of the phase shift film 4 has a periodic structure depending on the thickness of the phase shift film 4. As a result, as illustrated an example in FIG. 3, the reflectance and the phase difference of the phase shift film 4 also show a periodic structure depending on the thickness. In FIG. 3, the phase shift film 4 is a RuCr film, and it is a drawing showing the relationship between a thickness of the phase shift film 4 and relative reflectance and phase difference of EUV light when the atomic ratio of Ru and Cr is Ru:Cr=56:44. The refractive index n and the extinction coefficient k of the material of the phase shift film 4 affect the periodic structure. On the other hand, the reflected light from the phase shift pattern 4a needs to have a predetermined phase difference (for example, a phase difference of 180 degrees) to the reflected light from an opening portion. Taking the above into consideration comprehensively, as a result of investigation of the relationship between the relative reflectance of the phase shift film 4 and the composition and the thickness of the predetermined Ru-based material, a preferable range can be shown with regard to the composition and the thickness of the predetermined Ru-based material depending on the relative reflectance of the phase shift film 4 as described below. As illustrated in FIG. 3, when the phase shift film 4 is formed by the RuCr film (Ru:Cr=56:44), the thickness is 32.6 nm, the relative reflectance to the multilayer reflective film (with a protective film) is 20%, and the phase difference is about 180 degrees. In the above description, the relative reflectance of the phase shift film 4 can be replaced by an absolute reflectance, and in FIG. 3, when the phase shift film 4 is formed by the RuCr film (Ru:Cr=56:44), the thickness is 32.6 nm, the absolute reflectance is 13.3% and the phase difference is about 180 degrees.

When the material of the phase shift film 4 of the reflective mask blank 100 of the present embodiment contains Ru and Cr, the composition ratio of Ru and Cr (Ru:Cr) is preferably 15:1 to 1:20.

Specifically, when the material of the phase shift film 4 contains Ru and Cr, the relationships of the relative reflectance of the phase shift film 4, the absolute reflectance of the phase shift film 4, the composition (atomic ratio) of the predetermined Ru-based material and the thickness are as follows. That is, when the relative reflectance of the phase shift film 4 is 6% or more (absolute reflectance is 4% or more), Cr is 20 or less when the atomic ratio of Ru is made 1 and the thickness is 50 nm or less. When the relative reflectance of the phase shift film 4 is 15% or more (absolute reflectance is 10% or more), Cr is 4 or less when the atomic ratio of Ru is made 1 and the thickness is 45 nm or less. When the relative reflectance of the phase shift film 4 is 25% or less (absolute reflectance is 17% or less), Ru is 5 or less when the atomic ratio of Cr is made 1 and the thickness is 30 nm or more. When the relative reflectance of the phase shift film 4 is 40% or less (absolute reflectance is 27% or less), Ru is 15 or less when the atomic ratio of Cr is made 1 and the thickness is 25 nm or more.

When the material of the phase shift film 4 of the reflective mask blank 100 of the present embodiment contains Ru and Ni, the composition ratio of Ru and Ni (Ru:Ni) is preferably 20:1 to 1:4.

Specifically, when the material of the phase shift film 4 contains Ru and Ni, the relationships of the relative reflectance of the phase shift film 4, the absolute reflectance of the phase shift film 4, the composition (atomic ratio) of the predetermined Ru-based material and the thickness are as follows. That is, when the relative reflectance of the phase shift film 4 is 6% or more (absolute reflectance is 4% or more), Ni is 4 or less when the atomic ratio of Ru is made 1 and the thickness is 45 nm or less. When the relative reflectance of the phase shift film 4 is 15% or more (absolute reflectance is 10% or more), Ni is 1 or less when the atomic ratio of Ru is made 1 and the thickness is 45 nm or less. When the relative reflectance of the phase shift film 4 is 25% or less (absolute reflectance is 17% or less), Ru is 10 or less when the atomic ratio of Ni is made 1 and the thickness is 30 nm or more. When the relative reflectance of the phase shift film 4 is 40% or less (absolute reflectance is 27% or less), Ru is 20 or less when the atomic ratio of Ni is made 1 and the thickness is 25 nm or more.

When the material of the phase shift film 4 of the reflective mask blank 100 of the present embodiment contains Ru and Co, the composition ratio of Ru and Co (Ru:Co) is preferably 20:1 to 1:5.

Specifically, when the material of the phase shift film 4 contains Ru and Co, the relationships of the relative reflectance of the phase shift film 4, the absolute reflectance of the phase shift film 4, the composition (atomic ratio) of the predetermined Ru-based material and the thickness are as follows. That is, when the relative reflectance of the phase shift film 4 is 6% or more (absolute reflectance is 4% or more), Co is 5 or less when the atomic ratio of Ru is made 1 and the thickness is 40 nm or less. When the relative reflectance of the phase shift film 4 is 15% or more (absolute reflectance is 10% or more), Co is 1.5 or less when the atomic ratio of Ru is made 1 and the thickness is 40 nm or less. When the relative reflectance of the phase shift film 4 is 25% or less (absolute reflectance is 17% or less), Ru is 10 or less when the atomic ratio of Co is made 1 and the thickness is 30 nm or more. When the relative reflectance of the phase shift film 4 is 40% or less (absolute reflectance is 27% or less), Ru is 20 or less when the atomic ratio of Co is made 1 and the thickness is 25 nm or more.

As stated above, when the composition (atomic ratio) of Ru, and Cr, Ni and Co is in the predetermined range, a phase shift film 4 having high reflectance and predetermined phase difference can be obtained with a thin film thickness.

In addition, when the phase shift film 4 contains Ru and Al, when it contains Ru and Si, when it contains Ru and Ti, when it contains Ru and V, when it contains Ru and Ge, when it contains Ru and Nb, when it contains Ru and Mo, when it contains Ru and Sn, when it contains Ru and Te, when it contains Ru and Hf, when it contains Ru and W, and when it contains Ru and Re, the relationships of the relative reflectance of the phase shift film 4, the absolute reflectance of the phase shift film 4, the composition (atomic ratio) of the predetermined Ru-based material and the thickness are as follows.

When the material of the phase shift film 4 of the reflective mask blank 100 of the present embodiment contains Ru and Al, the composition ratio of Ru and Al (Ru:Al) is preferably 20:1 to 4:5.

When the relative reflectance of the phase shift film 4 is 6% or more (absolute reflectance is 4% or more), Al is 5 or less when the atomic ratio of Ru is made 4 and the thickness is 67 nm or less. When the relative reflectance of the phase shift film 4 is 15% or more (absolute reflectance is 10% or more), Al is 7 or less when the atomic ratio of Ru is made 13 and the thickness is 50 nm or less. When the relative reflectance of the phase shift film 4 is 25% or less (absolute reflectance is 17% or less), Ru is 4 or less when the atomic ratio of Al is made 1 and the thickness is 36 nm or more. When the relative reflectance of the phase shift film 4 is 40% or less (absolute reflectance is 27% or less), Ru is 20 or less when the atomic ratio of Al is made 1 and the thickness is 30 nm or more.

When the material of the phase shift film 4 of the reflective mask blank 100 of the present embodiment contains Ru and Si, the composition ratio of Ru and Si (Ru:Si) is preferably 20:1 to 1:1.

When the relative reflectance of the phase shift film 4 is 15% or more (absolute reflectance is 10% or more), Si is 1 or less when the atomic ratio of Ru is made 1 and the thickness is 70 nm or less. When the relative reflectance of the phase shift film 4 is 40% or less (absolute reflectance is 27% or less), Ru is 20 or less when the atomic ratio of Si is made 1 and the thickness is 30 nm or more.

When the material of the phase shift film 4 of the reflective mask blank 100 of the present embodiment contains Ru and Ti, the composition ratio Ru and Ti (Ru:Ti) is preferably 20:1 to 1:20.

When the relative reflectance of the phase shift film 4 is 15% or more (absolute reflectance is 10%), Ti is 20 or less when the atomic ratio of Ru is made 1 and the thickness is 66 nm or less. When the relative reflectance of the phase shift film 4 is 25% or less (absolute reflectance is 17% or less), Ru is 4 or less when the atomic ratio of Ti is made 6 and the thickness is 45 nm or more. When the relative reflectance of the phase shift film 4 is 40% or less (absolute reflectance is 27% or less), Ru is 20 or less when the atomic ratio of Ti is made 1 and the thickness is 30 nm or more.

When the material of the phase shift film 4 of the reflective mask blank 100 of the present embodiment contains Ru and V, the composition ratio of Ru and V (Ru:V) is preferably 20:1 to 1:20.

When the relative reflectance of the phase shift film 4 is 6% or more, V is 20 or less when the atomic ratio of Ru is made 1 and the thickness is 55 nm or less. When the relative reflectance of the phase shift film 4 is 15% or more, V is 7 or less when the atomic ratio of Ru is made 2 and the thickness is 47 nm or less. When the relative reflectance of the phase shift film 4 is 25% or less, Ru is 11 or less when the atomic ratio of V is made 9 and the thickness is 37 nm or more. When the relative reflectance of the phase shift film 4 is 40% or less, Ru is 20 or less when the atomic ratio of V is made 1 and the thickness is 30 nm or more.

When the material of the phase shift film 4 of the reflective mask blank 100 of the present embodiment contains Ru and Ge, the composition ratio of Ru and Ge (Ru:Ge) is preferably 20:1 to 1:1.

When the relative reflectance of the phase shift film 4 is 6% or more (absolute reflectance is 4% or more), Ge is 1 or less when the atomic ratio of Ru is made 1 and the thickness is 66 nm or less. When the relative reflectance of the phase shift film 4 is 15% or more (absolute reflectance is 10% or more), Ge is 3 or less when the atomic ratio of Ru is made 7 and the thickness is 46 nm or less. When the relative reflectance of the phase shift film 4 is 25% or less (absolute reflectance is 17% or less), Ru is 5 or less when the atomic ratio of Ge is made 1 and the thickness is 38 nm or more. When the relative reflectance of the phase shift film 4 is 40% or less (absolute reflectance is 27% or less), Ru is 20 or less when the atomic ratio of Ge is made 1 and the thickness is 31 nm or more.

When the material of the phase shift film 4 of the reflective mask blank 100 of the present embodiment contains Ru and Nb, the composition ratio of Ru and Nb (Ru:Nb) is preferably 20:1 to 5:1.

When the relative reflectance of the phase shift film 4 is 15% or more (absolute reflectance was 10% or more), Nb is 1 or more when the atomic ratio of Ru is made 20 and the thickness is 30 nm or more. When the relative reflectance of the phase shift film 4 is 40% or less (absolute reflectance is 27% or less), Ru is 5 or more when the atomic ratio of Nb is made 1 and the thickness is 32 nm or less.

When the material of the phase shift film 4 of the reflective mask blank 100 of the present embodiment contains Ru and Mo, the composition ratio of Ru and Mo (Ru:Mo) is preferably 20:1 to 4:1.

When the relative reflectance of the phase shift film 4 is 15% or more (absolute reflectance is 10% or more), Mo is 1 or more when the atomic ratio of Ru is made 20 and the thickness is 30 nm or more. When the relative reflectance of the phase shift film 4 is 40% or less (absolute reflectance is 27% or less), Ru is 4 or more when the atomic ratio of Mo is made 1, and the thickness is 33 nm or less.

When the material of the phase shift film 4 of the reflective mask blank 100 of the present embodiment contains Ru and Sn, the composition ratio of Ru and Sn (Ru:Sn) is preferably 20:1 to 3:2.

When the relative reflectance of the phase shift film 4 is 6% or more (absolute reflectance is 4% or more), Sn is 2 or less when the atomic ratio of Ru is made 3 and the thickness is 39 nm or less. When the relative reflectance of the phase shift film 4 is 15% or more (absolute reflectance is 10% or more), Sn is 1 or less when the atomic ratio of Ru is made 4 and the thickness is 33 nm or less. When the relative reflectance of the phase shift film 4 is 25% or less (absolute reflectance is 17% or less), Ru is 23 or less when the atomic ratio of Sn is made 2 and the thickness is 31 nm or more. When the relative reflectance of the phase shift film 4 is 40% or less (absolute reflectance is 27% or less), Ru is 20 or less when the atomic ratio of Sn is made 1 and the thickness is 30 nm or more.

When the material of the phase shift film 4 of the reflective mask blank 100 of the present embodiment contains, the composition ratio Ru and Te (Ru:Te) is preferably 20:1 to 3:1.

When the relative reflectance of the phase shift film 4 is 6% or more (absolute reflectance is 4% or more), Te is 1 or less when the atomic ratio of Ru is made 3 and the thickness is 40 nm or less. When the relative reflectance of the phase shift film 4 is 15% or more (absolute reflectance is 10% or more), Te is 1 or less when the atomic ratio of Ru is made 8 and the thickness is 33 nm or less. When the relative reflectance of the phase shift film 4 is 25% or less (absolute reflectance is 17% or less), Ru is 15 or less when the atomic ratio of Te is made 1 and the thickness is 31 nm or more. When the relative reflectance of the phase shift film 4 is 40% or less (absolute reflectance is 27% or less), Ru is 20 or less when the atomic ratio of Te is made 1 and the thickness is 30 nm or more.

When the material of the phase shift film 4 of the reflective mask blank 100 of the present embodiment contains Ru and Hf, the composition ratio of Ru and Hf (Ru:Hf) is preferably 20:1 to 1:2.

When the relative reflectance of the phase shift film 4 is 6% or more (absolute reflectance is 4% or more), Hf is 2 or less when the atomic ratio of Ru is made 1 and the thickness is 58 nm or less. When the relative reflectance of the phase shift film 4 is 15% or more (absolute reflectance is 10% or more), Hf is 9 or less when the atomic ratio of Ru is made 16 and the thickness is 40 nm or less. When the relative reflectance of the phase shift film 4 is 25% or less (absolute reflectance is 17% or less), Ru is 41 or less when the atomic ratio of Hf is made 9 and the thickness is 32 nm or more. When the relative reflectance of the phase shift film 4 is 40% or less (absolute reflectance is 27% or less), Ru is 20 or less when the atomic ratio of Hf is made 1 and the thickness is 30 nm or more.

When the material of the phase shift film 4 of the reflective mask blank 100 of the present embodiment contains Ru and W, the composition ratio of Ru and W (Ru:W) is preferably 20:1 to 1:20.

When the relative reflectance of the phase shift film 4 is 6% or more (absolute reflectance was 4% or more), W is 20 or less when the atomic ratio of Ru is made 1 and the thickness is 46 nm or less. When the relative reflectance of the phase shift film 4 is 15% or more (absolute reflectance was 10% or more), W is 33 or less when the atomic ratio of Ru is made 17 and the thickness is 39 nm or less. When the relative reflectance of the phase shift film 4 is 25% or less (absolute reflectance is 17% or less), Ru is 13 or less when the atomic ratio of W is made 7 and the thickness is 32 nm or more. When the relative reflectance of the phase shift film 4 is 40% or less (absolute reflectance is 27% or less), Ru is 20 or less when the atomic ratio of W is made 1 and the thickness is 30 nm or more.

When the material of the phase shift film 4 of the reflective mask blank 100 of the present embodiment contains Ru and Re, the composition ratio of Ru and Re (Ru:Re) is preferably 20:1 to 1:20.

When the relative reflectance of the phase shift film 4 is 6% or more (absolute reflectance is 4% or more), Re is 20 or less when the atomic ratio of Ru is made 1 and the thickness is 38 nm or less. When the relative reflectance of the phase shift film 4 is 15% or more (absolute reflectance is 10% or more), Re is 16 or less when the atomic ratio of Ru is made 9 and the thickness is 33 nm or less. When the relative reflectance of the phase shift film 4 is 25% or less (absolute reflectance is 17% or less), Ru is 16 or less when the atomic ratio of Re is made 9 and the thickness is 32 nm or more. When the relative reflectance of the phase shift film 4 is 40% or less (absolute reflectance is 27% or less), Ru is 20 or less when the atomic ratio of Re is made 1 and the thickness is 29 nm or more.

As stated above, when the composition (atomic ratio) of Ru, and Al, Si, Ti, V, Ge, Nb, Mo, Sn, Te, Hf, W or Re is in the predetermined range, a phase shift film 4 having high reflectance and predetermined phase difference can be obtained with a thin film thickness.

In the above description, a binary predetermined Ru-based material has been mainly described, a ternary material (for example, RuCrNi, RuCrCo, RuNiCo and RuCrW) and a quaternary material (for example, RuCrNiCo and RuCrCoW) have the same properties as the binary predetermined Ru-based material. Therefore, as the predetermined Ru-based material, a ternary or a quaternary material may be used.

The predetermined Ru-based material that is a material for the phase shift film 4 can contain Ru, and at least one or more elements among Cr, Ni, Co, Al, Si, Ti, V, Ge, Nb, Mo, Sn, Te, Hf, W and Re, and further can contain an element(s) other than these elements within a range that does not significantly affect the refractive index and the extinction coefficient. The predetermined Ru-based material may contain, for example, an element(s) such as nitrogen (N), oxygen (O), carbon (C), boron (B) and the like. For example, when nitrogen (N) is added to the predetermined Ru-based material, oxidation of the phase shift film 4 can be suppressed so that properties of the phase shift film 4 can be stabilized. Also, when nitrogen (N) is added to the predetermined Ru-based material, it is possible to easily make the crystal state amorphous regardless of film forming conditions of sputtering. In this case, the content of nitrogen is preferably 1 atomic % or more, and more preferably 3 atomic % or more. Further, the content of nitrogen is preferably 10 atomic % or less. With regard to oxygen (O), carbon (C), boron (B) and the like, these can be added to the material of the phase shift film 4 for stabilization of the phase shift film 4 or the like, within a range that does not significantly affect the refractive index and the extinction coefficient. When the material of the phase shift film 4 contains Ru, at least one or more elements of Cr, Ni, Co, Al, Si, Ti, V, Ge, Nb, Mo, Sn, Te, Hf, W and Re, and elements other than these, the content of the elements other than the above-described elements is preferably 10 atomic % or less, and more preferably 5 atomic % or less.

The phase shift film 4 of the above-described predetermined Ru-based material can be formed by a known method such as a magnetron sputtering, including DC sputtering, RF sputtering and the like. Also, as a target, an alloy target of Ru, and at least one or more elements of Cr, Ni, Co, Al, Si, Ti, V, Ge, Nb, Mo, Sn, Te, Hf, W and Re can be used.

Also, as the target, a film can be formed by co-sputtering using a Ru target, and a Cr target, a Ni target, a Co target, an Al target, a Si target, a Ti target, a V target, a Ge target, a Nb target, a Mo target, a Sn target, a Te target, a Hf target, a W target and/or a Re target. Whereas co-sputtering has an advantage that the composition ratio of the metal elements can be easily adjusted, it may be more likely that the crystal state of the film becomes a columnar structure compared with the alloy target. At the time of sputtering, the crystal state can be amorphous by forming the film so as to contain nitrogen (N) in the film.

The phase shift film 4 may be a film of a single-layer containing a film of the predetermined Ru-based material alone, or may be a multilayer film composed of a plurality of films of two or more layers. In the case of the single-layer film, there is a characteristic that the number of steps for manufacturing a mask blank can be reduced and the production efficiency can be improved. Incidentally, when the phase shift film 4 is, for example, a single-layer film such as a predetermined Ru-based material film and the like which does not substantially contain oxygen, a natural oxide film is formed on the surface layer by being exposed the phase shift film 4 after film formation to the atmosphere. In this case, it is preferable that the natural oxide film is removed by a fluorine-based gas and thereafter etching is performed by a chlorine-based gas.

Also, because EUV light has a short wavelength, there is a tendency that the film thickness dependence of the phase difference and the reflectance is large. Therefore, stability of the phase difference and the reflectance to the thickness variation of the phase shift film 4 is required. However, as illustrated in FIG. 3, each of the phase difference and the reflectance shows a vibration structure to the thickness of the phase shift film 4. Because the vibration structures of the phase difference and the reflectance are different, it is difficult to make the thickness that can stabilize both of the phase difference and the reflectance.

Thus, even if the thickness of the phase shift film 4 slightly changes with respect to the design value (for example, within the range of ±0.5% based on the designed thickness), with regard to the phase difference, variation of the phase difference between the surfaces is desirably within the range of the predetermined phase difference±2 degrees (for example, when the phase difference is 180 degrees, within the range of 180 degrees±2 degrees), and with regard to the reflectance, variation of the reflectance between the surfaces is desirably within the range of the predetermined reflectance±0.2% (for example, when the relative reflectance is 6%, within the range of 6%±0.2%). When the phase shift film 4 is a multilayer film, it becomes easy to control the variation of the phase difference between the surfaces and the variation of the reflectance between the surfaces within a predetermined range. As described above, it is possible to provide various functions to the respective layers by making the phase shift film 4 a multilayer film.

When the phase shift film 4 is formed by the outermost layer and a lower layer that is a layer other than the outermost layer, the reflected light of the EUV light from the surface of the outermost layer is suppressed. So, it is possible to obtain a stable phase difference and reflectance against thickness variation by making the vibration structure smooth. As a material for such an outermost layer, a silicon compound or a tantalum compound having a larger refractive index than that of the lower layer of the phase shift film 4 is preferable. A material containing Si and at least one element selected from N, O, C and H may be mentioned as the silicon compound, and preferably $SiO_2$, SiON and $Si_3N_4$ are mentioned. A material containing Ta and at least one element selected from N, O, C, H and B may be mentioned as the tantalum compound, and preferably a material containing Ta and O is mentioned. The thickness of the outermost layer is preferably 10 nm or less, more preferably 1 to 6 nm, and further preferably 3 to 5 nm. When the lower layer is a RuCr film, for example, the outermost layer can be a $SiO_2$ film or a $Ta_2O_5$ film.

The phase shift film 4 of a predetermined ruthenium (Ru)-based material, which is a material containing Ru and a metal containing at least one or more elements of Cr, Ni, Co, V, Nb, Mo, W and Re, can be etched by dry etching using a chlorine-based gas containing oxygen, or an oxygen gas. Further, the phase shift film 4 of a predetermined ruthenium (Ru)-based material, which is a material containing Ru and a metal containing at least one or more elements of Al, Si, Ti, Ge, Sn and Hf, can be etched by dry etching using a chlorine-based gas containing no oxygen. The chlorine-based gases that can be used are $Cl_2$, $SiCl_4$, $CHCl_3$, $CCl_4$, $BCl_3$ and the like. These etching gases can contain an inert gas such as He and/or Ar or the like, if necessary.

Further, the phase shift film 4 of a predetermined ruthenium (Ru)-based material, which is a metal containing Ru and at least one or more elements of Al, Si, Ti, Nb, Mo, Sn, Te, Hf, W and Re, can be etched by dry etching using a fluorine-based gas. As the fluorine-based gases that can be used are $CF_4$, $CHF_3$, $C_2F_6$, $C_3F_6$, $C_4F_6$, $C_4F_8$, $CH_2F_2$, $C_3F_8$, and/or $SF_6$ and the like. These etching gases may be used alone or may be a mixed gas of two or more selected from the above-described fluorine-based gases. In addition, it may contain an inert gas such as He and/or Ar or the like, or an $O_2$ gas, if necessary.

<<Etching Mask Film>>

An etching mask film can be formed on the phase shift film 4 or in contact with the surface of the phase shift film 4. As a material for the etching mask film, a material having a high etching selectivity of the phase shift film 4 to the etching mask film 25 is used. Here, the "etching selectivity of B to A" refers to the ratio of the etching rate of B that is a layer on which etching is desired to be carried out to A that is a layer where etching is not carried out (layer serving as mask). More specifically, etching selectivity is specified with the equation "etching selectivity of B to A=etching rate of B/etching rate of A". In addition, "high selectivity" means that a value of the selectivity defined above is large relative to the comparison target. The etching selectivity of the phase shift film 4 to the etching mask film is preferably 1.5 or more and more preferably 3 or more.

The phase shift film 4 of a predetermined ruthenium (Ru)-based material, which is a material containing a metal of Ru and at least one or more elements of Cr, Ni, Co, V, Nb, Mo, W and Re, can be etched by dry etching using a chlorine-based gas containing oxygen, or an oxygen gas. A material of silicon or a silicon compound, or a tantalum (Ta)-based material can be used as a material of the etching mask film, which has high etching selectivity to the phase shift film 4 of a predetermined ruthenium (Ru)-based material.

The silicon compound that can be used for the etching mask film may be a material containing Si and at least one element selected from N, O, C and H, and a material such as metal silicon (metal silicide) or a metal silicon compound (metal silicide compound) that is silicon or a silicon compound containing a metal, or the like. A material containing a metal and Si, and at least one element selected from N, O, C and H may be mentioned as the metal silicon compound.

A material containing tantalum (Ta) and one or more elements selected from oxygen (O), nitrogen (N), carbon (C), boron (B) and hydrogen (H) may be mentioned as a tantalum (Ta)-based material that can be used as an etching mask film. Among these, it is particularly preferable to use a material containing tantalum (Ta) and oxygen (O) as a material of the etching mask film. Specific examples of such a material may be tantalum oxide (TaO), tantalum oxynitride (TaON), tantalum boroxide (TaBO), tantalum boroxynitride (TaBON) and the like.

In addition, the phase shift film 4 of a predetermined ruthenium (Ru)-based material, which is a material containing Ru and at least one or more elements of Al, Si, Ti, Ge, Sn and Hf, can be etched by dry etching using a chlorine-based gas containing no oxygen. A material of silicon or a silicon compound can be used as a material of the etching mask film, which has a high etching selectivity to the phase shift film 4 of a predetermined ruthenium (Ru)-based material. As the silicon-based compound, a material containing Si and at least one element selected from N, O, C and H, and a material such metal silicon (metal silicide) or a metal silicon compound (metal silicide compound) that is silicon or a silicon compound containing a metal, or the like may be mentioned. A material containing a metal and Si, and at least one element selected from N, O, C and H may be mentioned as the metal silicon compound.

Further, the phase shift film 4 of a predetermined ruthenium (Ru)-based material that is a metal containing Ru and at least one or more elements of Al, Si, Ti, Nb, Mo, Sn, Te, Hf, W and Re, can be etched by dry etching using a fluorine-based gas.

Also, when the phase shift film 4 comprises a plurality of layers and when the outermost layer of the phase shift film 4 is to be etched by a fluorine-based gas, a material of chromium or a chromium compound can be used as a material of the etching mask film. A material containing Cr and at least one element selected from N, O, C and H may be mentioned as the chromium compound.

The thickness of the etching mask film is desirably 3 nm or more from the viewpoint of obtaining a function as an etching mask for forming a transfer pattern on the phase shift film 4 with good accuracy. In addition, the thickness of the etching mask film is desirably 15 nm or less from the viewpoint of making the thickness of the resist film 11 thin.

<<Back Side Conductive Film 5>>

On the second main surface (back surface) side (the side opposite to the surface on which the multilayer reflective film 2 is formed) of the substrate 1, a back side conductive film 5 for an electrostatic chuck is generally formed. Electrical characteristics (sheet resistance) required for the back side conductive film 5 is generally 100Ω/☐ (Ω/Square) or less. The back side conductive film 5 can be formed by, for example, a magnetron sputtering method or an ion beam sputtering method, using a target of a metal such as chromium, tantalum and the like and an alloy.

The material containing chromium (Cr) of the back side conductive film 5 is preferably a Cr compound containing Cr, and further containing at least one selected from boron, nitrogen, oxygen and carbon. Examples of the Cr compound can include CrN, CrON, CrCN, CrCO, CrCON, CrBN, CrBON, CrBCN, CrBOCN and the like.

It is preferable to use, as the material containing tantalum (Ta) of the back side conductive film 5, Ta (tantalum), an alloy containing Ta, or a Ta compound containing either of these and at least one of boron, nitrogen, oxygen and carbon. Examples of the Ta compound can include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON and the like.

As the material containing tantalum (Ta) or chromium (Cr), it is preferable that nitrogen (N) existing at the surface layer is little. Specifically, the content of nitrogen in the surface layer of the back side conductive film 5 that is a material containing tantalum (Ta) or chromium (Cr) is preferably less than 5 atomic %, and more preferably substantially containing no nitrogen in the surface layer. This is because, when the content of nitrogen in the surface layer is little, wear resistance becomes high.

The back side conductive film 5 is preferably made of a material containing tantalum and boron. When the back side conductive film 5 is made of a material containing tantalum and boron, a back side conductive film 5 having wear resistance and chemical liquid resistance can be obtained. When the back side conductive film 5 contains tantalum (Ta) and boron (B), the content of B is preferably 5 to 30 atomic %. The ratio of Ta and B (Ta:B) in the sputtering target used for film formation of the back side conductive film 5 is preferably 95:5 to 70:30.

A thickness of the back side conductive film 5 is not particularly limited as long as it satisfies the function for electrostatic chuck. The thickness of the back side conductive film 5 is usually from 10 nm to 200 nm. Further, the back side conductive film 5 also has a function of adjusting stress on the second main surface side of the mask blank 100. The back side conductive film 5 balances and adjusts the stresses from various films formed on the first main surface side for obtaining a flat reflective mask blank 100.

<Reflective Mask 200 and Method of Manufacturing Thereof>

The present embodiment is a reflective mask 200 having a phase shift pattern 4a that is obtained by patterning the phase shift film 4 of the above-described reflective mask blank 100. The phase shift pattern 4a can be formed by patterning the phase shift film 4 of the above-described reflective mask blank 100 by a predetermined dry etching gas (for example, a dry etching gas containing a chlorine-based gas and an oxygen gas). The phase shift pattern 4a of the reflective mask 200 can absorb EUV light and reflect a part of the EUV light with a predetermined phase difference (for example, 180 degree) from an opening (the portion where the phase shift pattern is not formed). A chlorine-based gas and an oxygen gas, a chlorine-based gas, and a fluorine-based gas and an oxygen gas, and the like can be used as the above-described predetermined dry etching gas. For patterning of the phase shift film 4, an etching mask film may be provided on the phase shift film 4, if necessary, and a phase shift pattern 4a may be formed by dry etching the phase shift film 4 using the etching mask film pattern as a mask.

A method of manufacturing the reflective mask 200 using the reflective mask blank 100 of the present embodiment will be described. Here, only a brief description will be given, and detailed description will be given later with reference to the drawings in Examples.

A reflective mask blank 100 is prepared, and a resist film 11 is formed on the phase shift film 4 of the first main surface thereof (when the resist film 11 is provided as a reflective mask blank 100, it is not required). A desired pattern is drawn (exposed) on the resist film 11, further developed and rinsed to form a predetermined resist pattern 11a.

In the case of the reflective mask blank 100, the phase shift film 4 is etched using the resist pattern 11a as a mask to form the phase shift pattern 4a, and the resist pattern 11a is removed by ashing, resist stripping liquid, or the like to form the phase shift pattern 4a. Finally, wet cleaning using an acidic or alkaline aqueous solution is performed.

The etching gas for the phase shift film 4 is appropriately selected depending on the predetermined Ru-based material. For example, in the case of the phase shift film 4 with a material containing Ru and at least one or more elements of Cr, Ni, Co, V, Nb, Mo, W and Re, a chlorine-based gas containing oxygen, or oxygen gas is used as the etching gas for the phase shift film 4. When the protective film 3 comprises silicon (Si), or a material containing silicon (Si) and oxygen (O), roughening does not occur on the surface of the protective film 3 at the time of etching the phase shift film 4.

Further, in the case of the phase shift film 4 with a material containing Ru and at least one or more elements of Al, Si, Ti, Ge, Sn and Hf, a fluorine-based gas or a chlorine-based gas containing no oxygen gas is used as the etching gas for the phase shift film 4. In this case, roughening does not occur at the surface of the protective film 3 at the time of etching the phase shift film 4 by appropriately selecting the material of the protective film 3 from a silicon-based material including silicon (Si), a material containing silicon (Si) and oxygen (O) or a material containing silicon (Si) and nitrogen (N), and a chromium-based material including chromium (Cr), or chromium (Cr) and at least one or more elements of oxygen (O), nitrogen (N) and carbon (C).

According to the above steps, the reflective mask 200 with less shadowing effect and having a highly precise fine pattern with less sidewall roughness can be obtained.

<Method of Manufacturing Semiconductor Device>

The present embodiment is a method of manufacturing a semiconductor device. A semiconductor device can be manufactured with the reflective mask 200 of the present embodiment that is set to an exposure device having an exposure light source of EUV light, and a transfer pattern is transferred to the resist film formed on a transferred substrate.

Specifically, by performing EUV exposure using the above-described reflective mask 200 of the present embodiment, a desired transfer pattern based on the phase shift pattern 4a on the reflective mask 200 can be formed on the semiconductor substrate by suppressing deterioration of the transfer dimensional accuracy due to the shadowing effect. In addition, the phase shift pattern 4a is a pattern that is fine and high accuracy with less side wall roughness so that a desired pattern can be formed on the semiconductor substrate with high dimensional accuracy. In addition to this lithography step, through various steps such as etching of a film to be processed, formation of an insulating film and a conductive film, introduction of a dopant, annealing, and the like, a semiconductor device having desired characteristics can be manufactured.

When more specifically described, the EUV exposure device is constituted by a laser plasma light source that generates EUV light, an illumination optical system, a mask stage system, a reduction projection optical system, a wafer stage system, vacuum equipment and the like. The light source is equipped with a debris trap function, a cut filter that cuts off long wavelength light other than exposure light and equipment for vacuum differential evacuation and the like. The illumination optical system and the reduction projection optical system are constituted by reflective mirrors. The reflective mask 200 for EUV exposure is placed on the mask stage by electrostatically adsorbed by the back side conductive film 5 formed on the second main surface.

The light of the EUV light source is irradiated to the reflective mask 200 through an illumination optical system at an inclined angle of 6 degrees to 8 degrees against the vertical surface of the reflective mask 200. The reflected light from the reflective mask 200 with respect to this incident light is reflected (regularly reflected) in the direction opposite to the incident direction and at the same angle as the incident angle and is guided to a reflective projection optical system that usually has a reduction ratio of 1/4, and exposure of the resist on the wafer (the semiconductor substrate) mounted on the wafer stage is performed. During this time, at least the place where EUV light passes is evacuated. Also, in this exposure, scan exposure is a mainstream, in which the mask stage and the wafer stage are synchronously scanned at a speed according to the reduction ratio of the reduction projection optical system, and exposure is performed through a slit. By developing this exposed resist film, a resist pattern can be formed on the semiconductor substrate. In the present embodiment, a mask that has a thin film with a small shadowing effect and has a highly accurate phase shift pattern with small side wall roughness is used. Therefore, the resist pattern formed on the semiconductor substrate becomes a desired pattern having high dimensional accuracy. By performing etching or the like using the resist pattern as a mask, for example, it is possible to form a predetermined wiring pattern on the semiconductor substrate. A semiconductor device having desired characteristics can be manufactured by undergoing such an exposure step, a processing step of a film to be processed, a formation step of an insulating film and a conductive film, a dopant introducing step, an annealing step, and the like, and other necessary steps.

According to the manufacturing method of the semiconductor device of the present embodiment, a reflective mask 200 that enables to make the thickness of a phase shift film 4 thin, to reduce the shadowing effect and to form a phase shift pattern 4a with fine and highly accurate with less side wall roughness and stable cross-sectional shape, can be used for manufacturing a semiconductor device. Therefore, a semiconductor device having a fine and highly accurate transfer pattern can be manufactured.

EXAMPLES

Hereinafter, examples will be described with reference to the drawings. The present embodiment is not limited to these Examples. In Examples, the same reference numerals are used for the same constitutional elements, and the description will be simplified or omitted.

Example 1

FIGS. 2A-2D are schematic sectional views of an essential part showing steps of fabricating the reflective mask 200 from the reflective mask blank 100.

Figure 2A:
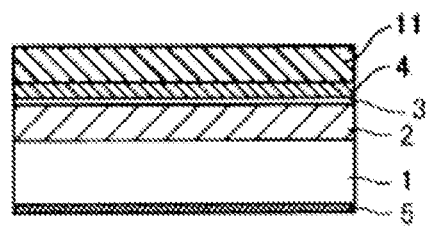
FIGS. 2A-2D are process diagrams illustrating schematic cross-sectional views of a main part of a process of manufacturing a reflective mask from a reflective mask blank.

The reflective mask blank 100 has a back side conductive film 5, a substrate 1, a multilayer reflective film 2, a protective film 3 and a phase shift film 4. The phase shift film 4 of Example 1 comprises a material containing RuCr. And as shown in FIG. 2A, a resist film 11 is formed on the phase shift film 4.

First, the reflective mask blank 100 of Example 1 will be described.

The substrate 1 was prepared by polishing both the first main surface and the second main surface of a $SiO_2$—$TiO_2$-based glass substrate that is a low thermal expansion glass substrate of 6025 size (about 152 mm×152 mm×6.35 mm). The polishing involved rough polishing, precision polishing, local processing, and touch polishing so as to produce flat and smooth main surfaces.

The back side conductive film 5 made of a CrN film was formed on the second main surface (back surface) of the $SiO_2$—$TiO_2$-based glass substrate 1 by magnetron sputtering (reactive sputtering) under the following conditions.

Formation conditions of back side conductive film 5: Cr target, mixed gas atmosphere of Ar and $N_2$ (Ar: 90%, N: 10%), film thickness 20 nm.

Next, the multilayer reflective film 2 was formed on the main surface (first main surface) of the substrate 1 opposite to the main surface on which the back side conductive film 5 was formed. The multilayer reflective film 2 formed on the substrate 1 was the periodic multilayer reflective film including Mo and Si in order to be the multilayer reflective film 2 suitable for EUV light having a wavelength of 13.5 nm. The multilayer reflective film 2 was formed by alternately layering Mo layers and Si layers on the substrate 1, by ion beam sputtering in an Ar gas atmosphere with a Mo target and a Si target. First, a Si film was formed with a thickness of 4.2 nm, and then a Mo film was formed with a thickness of 2.8 nm. This formation was counted as one period, and Si films and Mo films were layered for 40 periods in a similar manner, and finally, a Si film was formed with a thickness of 4.0 nm, so that the multilayer reflective film 2 was formed. Here, the number of building-up periods was 40, but it is not limited to this, and the number of building-up periods can be, for example, 60. In a case of 60 periods of building-up, the number of processes is larger than the number of processes with 40 periods, but the reflectance for EUV light can be increased.

Subsequently, the Ar gas the protective film 3 made of a $SiO_2$ film was formed on the surface of the multilayer reflective film 2 with a thickness of 2.5 nm by RF sputtering using a $SiO_2$ target in an Ar gas atmosphere.

Next, the phase shift film 4 made of a RuCr film was formed by DC magnetron sputtering. The RuCr film was formed using a RuCr target in an Ar gas atmosphere so as to have a thickness of 45.0 nm. The content ratio (atomic ratio) of the RuCr film was Ru:Cr=7:93. The crystal structure of the RuCr film was measured by an X-ray diffractometer (XRD), and the RuCr film had an amorphous structure.

The refractive index n and the extinction coefficient (refractive index imaginary part) k of the RuCr film of Example 1 formed as described above at the wavelength of 13.5 nm were as follows.

RuCr film: n=0.929, k=0.037

The relative reflectance of the phase shift film 4 made of the above-described RuCr film at the wavelength of 13.5 nm was 6% (absolute reflectance was 4%). Also, the thickness of the phase shift film 4 is 45.0 nm. This thickness is a thickness corresponding to a phase difference of 180 degrees when the phase shift film 4 is patterned. It was able to be about 31% thinner than 65 nm that is the thickness of the phase shift film 4 made of the TaN film in Comparative example 1 described later.

Next, a reflective mask 200 was manufactured using the above-described reflective mask blank 100.

Figure 2B:
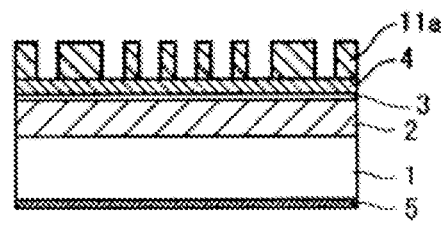
Figure 2C:
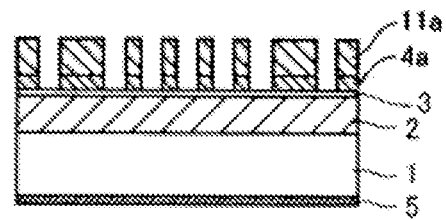

As described above, a resist film 11 with a thickness of 100 nm was formed on the phase shift film 4 of the reflective mask blank 100 (FIG. 2A). Then, a desired pattern was drawn (exposure) on the resist film 11, and further developed and rinsed to form the predetermined resist pattern 11a (FIG. 2B). Next, using the resist pattern 11a as a mask, the RuCr film (the phase shift film 4) was dry-etched using a mixed gas of a $Cl_2$ gas and an $O_2$ gas (ratio of gas flow rates $Cl_2$:$O_2$=4:1) to form the phase shift pattern 4a (FIG. 2C).

Figure 2D:
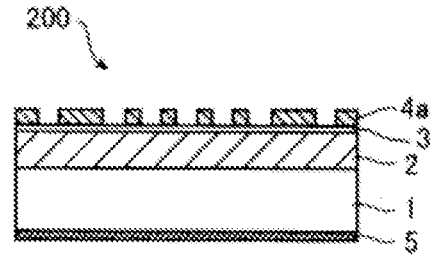

Thereafter, the resist pattern 11a was removed by ashing, resist stripping liquid, or the like. Finally, wet cleaning using pure water (DIW) was performed to produce the reflective mask 200 (FIG. 2D). If necessary, after wet cleaning, mask defect inspection can be performed and mask defects can be corrected appropriately.

Since the phase shift film 4 of the reflective mask 200 of Example 1 was made of a RuCr material, workability with a mixed gas of a $Cl_2$ gas and an $O_2$ gas was good, and the phase shift pattern 4a was able to be formed with high accuracy. In addition, the thickness of the phase shift pattern 4a was 45.0 nm, which was able to be thinner than the absorber film formed by the conventional Ta-based material, and the shadowing effect was able to be reduced compared to Comparative example 1.

Also, since the reflective mask 200 manufactured in Example 1 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface (reflectance with respect to the reflectance of the multilayer reflective film surface attached with a protective film) was 6% (absolute reflectance was 4%), so that a sufficient phase shift effect was able to be obtained, and EUV exposure with high exposure margin and focus margin was able to be performed.

The reflective mask 200 manufactured in Example 1 was set to an EUV scanner, and EUV exposure was performed on a wafer that is a semiconductor substrate on which a film to be processed and a resist film had been formed. Then, the exposed resist film was developed to form a resist pattern on the semiconductor substrate on which the film to be processed had been formed. This resist pattern was transferred to the film to be processed by etching, and through various steps such as formation of an insulating film and a conductive film, introduction of a dopant, annealing, and the like, a semiconductor device having desired characteristics was able to be manufactured.

Example 2

Example 2 is an example in which the material of the phase shift film 4 is changed to a RuNi film and the thickness is adjusted so as to have a phase difference of 180 degrees, and other than the above is the same as Example 1.

That is, in Example 2, the phase shift film 4 made of a RuNi film was formed by a DC magnetron sputtering on the protective film 3 made of a $SiO_2$ film. The RuNi film was formed using a RuNi target in an Ar gas atmosphere so as to have a thickness of 38.2 nm. The content ratio (atomic ratio) of the RuNi film was Ru:Ni=45:55. The crystal structure of the RuNi film was measured by an X-ray diffractometer (XRD), and the RuNi film had an amorphous structure.

The refractive index n and the extinction coefficient (refractive index imaginary part) k of the RuNi film of Example 2 formed as described above at the wavelength of 13.5 nm were as follows.

RuNi film: n=0.917, k=0.045

The relative reflectance of the phase shift film 4 made of the above-described RuNi film at the wavelength of 13.5 nm was 6% (absolute reflectance was 4%). Also, the thickness of the phase shift film 4 is 38.2 nm. This thickness is a thickness corresponding to a phase difference of 180 degrees when the phase shift film 4 is patterned. It was able to be about 41% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

Since the phase shift film 4 of the reflective mask 200 of Example 2 was made of a RuNi material, workability with a mixed gas of a $Cl_2$ gas and an $O_2$ gas was good, and the phase shift pattern 4a was able to be formed with high accuracy. In addition, the thickness of the phase shift pattern 4a was 38.2 nm, which was able to be thinner than the absorber film formed by the conventional Ta-based material, and the shadowing effect was able to be reduced compared to Comparative example 1.

Also, since the reflective mask 200 manufactured in Example 2 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 6% (absolute reflectance was 4%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 2.

Example 3

Example 3 is an example in which the material of the phase shift film 4 is changed to a RuCo film and the thickness is adjusted so as to have a phase difference of 180 degrees, and other than the above is the same as Example 1.

That is, in Example 3, the phase shift film 4 made of a RuCo film was formed by a DC magnetron sputtering on the protective film 3 made of a $SiO_2$ film. The RuCo film was formed using a RuCo target in an Ar gas atmosphere so as to have a thickness of 37.9 nm. The content ratio (atomic ratio) of the RuCo film was Ru:Co=36:64. The crystal structure of the RuCo film was measured by an X-ray diffractometer (XRD), and the RuCo film had an amorphous structure.

The refractive index n and the extinction coefficient (refractive index imaginary part) k of the RuCo film of Example 3 formed as described above at the wavelength of 13.5 nm were as follows.

RuCo film: n=0.914, k=0.046

The relative reflectance of the phase shift film 4 made of the above-described RuCo film at the wavelength of 13.5 nm was 6% (absolute reflectance was 4%). Also, the thickness of the phase shift film 4 is 37.9 nm. This thickness is a thickness corresponding to a phase difference of 180 degrees when the phase shift film 4 is patterned. It was able to be about 42% thinner than 65 nm that is the thickness of the phase shift film 4 made of the TaN film in Comparative example 1 described later, and the shadowing effect could be reduced.

Next, in the same manner as in Example 1, a reflective mask 200 was manufactured by using the above-described reflective mask blank 100.

Since the phase shift film 4 of the reflective mask 200 of Example 3 was made of a RuCo material, workability with a mixed gas of a $Cl_2$ gas and an $O_2$ gas was good, and the phase shift pattern 4a was able to be formed with high accuracy. In addition, the thickness of the phase shift pattern 4a was 37.9 nm, which was able to be thinner than the absorber film formed by the conventional Ta-based material, and the shadowing effect was able to be reduced compared to Comparative example 1.

Also, since the reflective mask 200 manufactured in Example 3 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 6% (absolute reflectance was 4%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 3.

Example 4

Example 4 is an example in which the relative reflectance of the phase shift film 4 was made to be 15% (absolute reflectance was 10%) and the thickness is adjusted so as to have a phase difference of 180 degrees, and other than the above is the same as Example 1 including the material (RuCr film).

That is, in Example 4, the phase shift film 4 made of a RuCr film was formed by a DC magnetron sputtering on the protective film 3 made of a $SiO_2$ film. The RuCr film was formed using a RuCr target in an Ar gas atmosphere so as to have a thickness of 37.9 nm. The content ratio (atomic ratio) of the RuCr film was Ru:Cr=39:61. The crystal structure of the RuCr film was measured by an X-ray diffractometer (XRD), and the RuCr film had an amorphous structure.

The refractive index n and the extinction coefficient (refractive index imaginary part) k of the RuCr film of Example 4 formed as described above at the wavelength of 13.5 nm were as follows.

RuCr film: n=0.913, k=0.030

The relative reflectance of the phase shift film 4 made of the above-described RuCr film at the wavelength of 13.5 nm was 15% (absolute reflectance was 10%). Also, the thickness of the phase shift film 4 is 37.9 nm. This thickness is a thickness corresponding to a phase difference of 180 degrees when the phase shift film 4 is patterned. It was able to be about 42% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

Since the phase shift film 4 of the reflective mask 200 of Example 4 was made of a RuCr material, workability with a mixed gas of a $Cl_2$ gas and an $O_2$ gas was good, and the phase shift pattern 4a was able to be formed with high accuracy. In addition, the thickness of the phase shift pattern 4a was 37.9 nm, which was able to be thinner than the absorber film formed by the conventional Ta-based material, and the shadowing effect was able to be reduced compared to Example 1.

Also, since the reflective mask 200 manufactured in Example 4 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 15% (absolute reflectance was 10%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 4. At that time, because the reflectance of the phase shift surface was 15%, throughput was able to be increased as compared with that of Example 1.

Example 5

Example 5 is an example in which the material of the phase shift film 4 is changed to a RuNi film, the relative reflectance of the phase shift film 4 was made to be 15% (absolute reflectance was 10%) and the thickness is adjusted so as to have a phase difference of 180 degrees, and other than the above is the same as Example 1.

That is, in Example 5, the phase shift film 4 made of a RuNi film was formed by a DC magnetron sputtering on the protective film 3 made of a $SiO_2$ film. The RuNi film was formed using a RuNi target in an Ar gas atmosphere so as to have a thickness of 32.2 nm. The content ratio (atomic ratio) of the RuNi film was Ru:Ni=67:33. The crystal structure of the RuNi film was measured by an X-ray diffractometer (XRD), and the RuNi film had an amorphous structure.

The refractive index n and the extinction coefficient (refractive index imaginary part) k of the RuNi film of Example 5 formed as described above at the wavelength of 13.5 nm were as follows.

RuNi film: n=0.904, k=0.033

The relative reflectance of the phase shift film 4 made of the above-described RuNi film at the wavelength of 13.5 nm was 15% (absolute reflectance was 10%). Also, the thickness of the phase shift film 4 is 32.2 nm. This thickness is a thickness corresponding to a phase difference of 180 degrees when the phase shift film 4 is patterned. It was able to be about 50% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

Since the phase shift film 4 of the reflective mask 200 of Example 5 was made of a RuNi material, workability with a mixed gas of a $Cl_2$ gas and an $O_2$ gas was good, and the phase shift pattern 4a was able to be formed with high accuracy. In addition, the thickness of the phase shift pattern 4a was 32.2 nm, which was able to be thinner than the absorber film formed by the conventional Ta-based material, and the shadowing effect was able to be reduced compared to Example 2.

Also, since the reflective mask 200 manufactured in Example 5 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 15% (absolute reflectance was 10%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 5. At that time, because the reflectance of the phase shift surface was 15% (absolute reflectance was 10%), throughput was able to be increased as compared with that of Example 2.

Example 6

Example 6 is an example in which the material of the phase shift film 4 is changed to a RuCo film, the relative reflectance of the phase shift film 4 was made to be 15% (absolute reflectance was 10%) and the thickness is adjusted so as to have a phase difference of 180 degrees, and other than the above is the same as Example 1.

That is, in Example 6, the phase shift film 4 made of a RuCo film was formed by a DC magnetron sputtering on the protective film 3 made of a $SiO_2$ film. The RuCo film was formed using a RuCo target in an Ar gas atmosphere so as to have a thickness of 31.9 nm. The content ratio (atomic ratio) of the RuCo film was Ru:Co=61:39. The crystal structure of the RuCo film was measured by an X-ray diffractometer (XRD), and the RuCo film had an amorphous structure.

The refractive index n and the extinction coefficient (refractive index imaginary part) k of the RuCo film of Example 6 formed as described above at the wavelength of 13.5 nm were as follows.

RuCo film: n=0.902, k=0.034

The relative reflectance of the phase shift film 4 made of the above-described RuCo film at the wavelength of 13.5 nm was 15% (absolute reflectance was 10%). Also, the thickness of the phase shift film 4 is 31.9 nm. This thickness is a thickness corresponding to a phase difference of 180 degrees when the phase shift film 4 is patterned. It was able to be about 51% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

Since the phase shift film 4 of the reflective mask 200 of Example 6 was made of a RuCo material, workability with a mixed gas of a Cl$_2$ gas and an O$_2$ gas was good, and the phase shift pattern 4a was able to be formed with high accuracy. In addition, the thickness of the phase shift pattern 4a was 31.9 nm, which was able to be thinner than the absorber film formed by the conventional Ta-based material, and the shadowing effect was able to be reduced compared to Example 3.

Also, since the reflective mask 200 manufactured in Example 6 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 15% (absolute reflectance was 10%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 6. At that time, because the reflectance of the phase shift surface was 15% (absolute reflectance was 10%), throughput was able to be increased as compared with that of Example 3.

Example 7

Example 7 is an example in which the relative reflectance of the phase shift film 4 was made to be 20% (absolute reflectance was 13.3%) and the thickness is adjusted so as to have a phase difference of 180 degrees, and other than the above is the same as Example 1 including the material (the RuCr film).

That is, in Example 7, the phase shift film 4 made of a RuCr film was formed by a DC magnetron sputtering on the protective film 3 made of a SiO$_2$ film. The RuCr film was formed using a RuCr target in an Ar gas atmosphere so as to have a thickness of 32.6 nm. The content ratio (atomic ratio) of the RuCr film was Ru:Cr=56:44. The crystal structure of the RuCr film was measured by an X-ray diffractometer (XRD), and the RuCr film had an amorphous structure.

The refractive index n and the extinction coefficient (refractive index imaginary part) k of the RuCr film of Example 7 formed as described above at the wavelength of 13.5 nm were as follows.

RuCr film: n=0.905, k=0.026

The relative reflectance of the phase shift film 4 made of the above-described RuCr film at the wavelength of 13.5 nm was 20% (absolute reflectance was 13.3%). Also, the thickness of the phase shift film 4 is 32.6 nm. This thickness is a thickness corresponding to a phase difference of 180 degrees when the phase shift film 4 is patterned. It was able to be about 50% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

Since the phase shift film 4 of the reflective mask 200 of Example 7 was made of a RuCr material, workability with a mixed gas of a Cl$_2$ gas and an O$_2$ gas was good, and the phase shift pattern 4a was able to be formed with high accuracy. In addition, the thickness of the phase shift pattern 4a was 32.6 nm, which was able to be thinner than the absorber film formed by the conventional Ta-based material, and the shadowing effect was able to be reduced compared to Example 4.

Also, since the reflective mask 200 manufactured in Example 7 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 20% (absolute reflectance was 13.3%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 7. At that time, because the reflectance of the phase shift surface was 20% (absolute reflectance was 13.3%), throughput was able to be increased as compared with that of Example 4.

Example 8

Example 8 is an example in which the material of the phase shift film 4 is changed to a RuNi film, the relative reflectance of the phase shift film 4 was made to be 20% (absolute reflectance was 13.3%) and the thickness is adjusted so as to have a phase difference of 180 degrees, and other than the above is the same as Example 1.

That is, in Example 8, the phase shift film 4 made of a RuNi film was formed by a DC magnetron sputtering on the protective film 3 made of a SiO$_2$ film. The RuNi film was formed using a RuNi target in an Ar gas atmosphere so as to have a thickness of 31.8 nm. The content ratio (atomic ratio) of the RuNi film was Ru:Ni=73:27. The crystal structure of the RuNi film was measured by an X-ray diffractometer (XRD), and the RuNi film had an amorphous structure.

The refractive index n and the extinction coefficient (refractive index imaginary part) k of the RuNi film of Example 8 formed as described above at the wavelength of 13.5 nm were as follows.

RuNi film: n=0.900, k=0.030

The relative reflectance of the phase shift film 4 made of the above-described RuNi film at the wavelength of 13.5 nm was 20% (absolute reflectance was 13.3%). Also, the thickness of the phase shift film 4 is 31.8 nm. This thickness is a thickness corresponding to a phase difference of 180 degrees when the phase shift film 4 is patterned. It was able to be about 51% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

In the reflective mask 200 of Example 8, the phase shift film 4 was made of a RuNi material, workability with a mixed gas of a $Cl_2$ gas and an $O_2$ gas was good, and the phase shift pattern 4a was able to be formed with high accuracy. In addition, the thickness of the phase shift pattern 4a was 31.8 nm, which was able to be thinner than the absorber film formed by the conventional Ta-based material, and the shadowing effect could be reduced to the same extent as in Example 5.

Also, since the reflective mask 200 manufactured in Example 8 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 20% (absolute reflectance was 13.3%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 8. At that time, because the reflectance of the phase shift surface was 20% (absolute reflectance was 13.3%), throughput was able to be increased as compared with that of Example 5.

Example 9

Example 9 is an example in which the material of the phase shift film 4 is changed to a RuCo film, the relative reflectance of the phase shift film 4 was made to be 20% (absolute reflectance was 13.3%) and the thickness is adjusted so as to have a phase difference of 180 degrees, and other than the above is the same as Example 1.

That is, in Example 9, the phase shift film 4 made of a RuCo film was formed by a DC magnetron sputtering on the protective film 3 made of a $SiO_2$ film. The RuCo film was formed using a RuCo target in an Ar gas atmosphere so as to have a thickness of 31.6 nm. The content ratio (atomic ratio) of the RuCo film was Ru:Co=69:31. The crystal structure of the RuCo film was measured by an X-ray diffractometer (XRD), and the RuCo film had an amorphous structure.

The refractive index n and the extinction coefficient (refractive index imaginary part) k of the RuCo film of Example 9 formed as described above at the wavelength of 13.5 nm were as follows.

RuCo film: n=0.899, k=0.030

The relative reflectance of the phase shift film 4 made of the above-described RuCo film at the wavelength of 13.5 nm was 20% (absolute reflectance was 13.3%). Also, the thickness of the phase shift film 4 is 31.6 nm. This thickness is a thickness corresponding to a phase difference of 180 degrees when the phase shift film 4 is patterned. It was able to be about 51% thinner than 65 nm that is the thickness of the phase shift film 4 made of the TaN film in Comparative example 1 described later.

Next, in the same manner as in Example 1, a reflective mask 200 was manufactured by using the above-described reflective mask blank 100.

Since the phase shift film 4 of the reflective mask 200 of Example 9 was made of a RuCo material, workability with a mixed gas of a $Cl_2$ gas and an $O_2$ gas was good, and the phase shift pattern 4a was able to be formed with high accuracy. In addition, the thickness of the phase shift pattern 4a was 31.6 nm, which was able to be thinner than the absorber film formed by the conventional Ta-based material, and the shadowing effect could be reduced to the same extent as in Example 6.

Also, since the reflective mask 200 manufactured in Example 9 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 20% (absolute reflectance was 13.3%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 9. At that time, because the reflectance of the phase shift surface was 20% (absolute reflectance was 13.3%), throughput was able to be increased as compared with that of Example 6.

Example 10

Example 10 is an example in which the material of the phase shift film 4 is changed to a RuNb film and the thickness is adjusted so as to have a phase difference of 180 degrees, and other than the above is the same as Example 1. That is, the phase shift film 4 made of a RuNb film was formed by a DC magnetron sputtering on a substrate with a multilayer reflective film on which the protective film 3 made of a $SiO_2$ film had been formed. The RuNb film was formed using a RuNb target in an Ar gas atmosphere so as to have a thickness of 30.3 nm. The content ratio (atomic ratio) of the RuNb film was Ru:Nb=20:1. The crystal structure of the RuNb film was measured by an X-ray diffractometer (XRD), and the RuNb film had an amorphous structure.

The refractive index n and the extinction coefficient (refractive index imaginary part) k of the RuNb film of Example 10 formed as described above at the wavelength of 13.5 nm were as follows.

RuNb film: n=0.888, k=0.017

The relative reflectance of the phase shift film 4 made of the above-described RuNb film at the wavelength of 13.5 nm was 39.7% (absolute reflectance was 26.5%). Also, the thickness of the phase shift film 4 is 30.3 nm. This thickness is a thickness corresponding to a phase difference of 180 degrees when the phase shift film 4 is patterned. It was able to be about 53% thinner than 65 nm that is the thickness of the phase shift film 4 made of the TaN film in Comparative example 1 described later.

Next, under the same conditions as in Example 1, a reflective mask 200 was manufactured by using the above-described reflective mask blank 100. Since the phase shift film 4 of the reflective mask 200 of Example 10 was a RuNb material, workability with a mixed gas of a $Cl_2$ gas and an $O_2$ gas was good, and the phase shift pattern 4a was able to be formed with high accuracy. In addition, the thickness of the phase shift pattern 4a was 30.3 nm, which was able to be thinner than the absorber film formed by the conventional Ta-based material, and the shadowing effect was able to be reduced compared to Comparative example 1.

Also, since the reflective mask 200 manufactured in Example 10 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 39.7% (absolute reflectance was 26.5%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 10.

Example 11

Example 11 is an example in which the material of the phase shift film 4 is changed to a RuV film and the thickness is adjusted so as to have a phase difference of 180 degrees, and other than the above is the same as Example 1. That is, the phase shift film 4 made of a RuV film was formed by a DC magnetron sputtering on a substrate with a multilayer reflective film on which the protective film 3 made of a $SiO_2$ film had been formed. The RuV film was formed using a RuV target in an Ar gas atmosphere so as to have a thickness of 39.7 nm. The content ratio (atomic ratio) of the RuV film was Ru:V=40:60. The crystal structure of the RuV film was measured by an X-ray diffractometer (XRD), and the RuV film had an amorphous structure.

The refractive index n and the extinction coefficient (refractive index imaginary part) k of the RuV film of Example 10 formed as described above at the wavelength of 13.5 nm were as follows.

RuV film: n=0.921, k=0.022

The relative reflectance of the phase shift film 4 made of the above-described RuV film at the wavelength of 13.5 nm was 18.8% (absolute reflectance was 12.5%). Also, the thickness of the phase shift film 4 is 39.7 nm. This thickness is a thickness corresponding to a phase difference of 180 degrees when the phase shift film 4 is patterned. It was able to be about 39% thinner than 65 nm that is the thickness of the phase shift film 4 made of the TaN film in Comparative example 1 described later.

Next, under the same conditions as in Example 1, a reflective mask 200 was manufactured by using the above-described reflective mask blank 100. Since the phase shift film 4 of the reflective mask 200 of Example 11 was made of a RuV material, workability with a mixed gas of a $Cl_2$ gas and an $O_2$ gas was good, and the phase shift pattern 4a was able to be formed with high accuracy. In addition, the thickness of the phase shift pattern 4a was 39.7 nm, which was able to be thinner than the absorber film formed by the conventional Ta-based material, and the shadowing effect was able to be reduced compared to Comparative example 1.

Also, since the reflective mask 200 manufactured in Example 11 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 18.8% (absolute reflectance was 12.5%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 11.

Example 12

Example 12 is an example in which the material of the phase shift film 4 is changed to a RuHf film and the thickness is adjusted so as to have a phase difference of 180 degrees, and other than the above is the same as Example 1. That is, the phase shift film 4 made of a RuHf film was formed by a DC magnetron sputtering on a substrate with a multilayer reflective film on which the protective film 3 made of a $SiO_2$ film had been formed. The RuHf film was formed using a RuHf target in an Ar gas atmosphere so as to have a thickness of 45.2 nm. The content ratio (atomic ratio) of the RuHf film was Ru:Hf=56:44. The crystal structure of the RuHf film was measured by an X-ray diffractometer (XRD), and the RuHf film had an amorphous structure.

The refractive index n and the extinction coefficient (refractive index imaginary part) k of the RuHf film of Example 12 formed as described above at the wavelength of 13.5 nm were as follows.

RuHf film: n=0.928, k=0.027

The relative reflectance of the phase shift film 4 made of the above-described RuHf film at the wavelength of 13.5 nm was 12.3% (absolute reflectance was 8.2%). Also, the thickness of the phase shift film 4 is 45.2 nm. This thickness is a thickness corresponding to a phase difference of 180 degrees when the phase shift film 4 is patterned. It was able to be about 30% thinner than 65 nm that is the thickness of the phase shift film 4 made of the TaN film in Comparative example 1 described later.

Next, under the same conditions as in Example 1 except that the dry etching gas of Example 1 was changed to a $Cl_2$ gas, a reflective mask 200 was manufactured by using the above-described reflective mask blank 100. In the reflective mask 200 of Example 12, the $Cl_2$ gas was used because the phase shift film 4 was a RuHf material, the dry etching time was slightly longer as compared to that of Example 1 but workability was good, and the phase shift pattern 4a was able to be formed with high accuracy. In addition, the thickness of the phase shift pattern 4a was 45.2 nm, which was able to be thinner than the absorber film formed by the conventional Ta-based material, and the shadowing effect was able to be reduced compared to Comparative example 1.

Also, since the reflective mask 200 manufactured in Example 12 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 12.3% (absolute reflectance was 8.2%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 12.

Example 13

Example 13 is an example in which the material of the phase shift film 4 is changed to a RuSn film and the thickness is adjusted so as to have a phase difference of 180 degrees, and other than the above is the same as Example 1. That is, the phase shift film 4 made of a RuSn film was formed by a DC magnetron sputtering on a substrate with a multilayer reflective film on which the protective film 3 made of a $SiO_2$ film had been formed. The RuSn film was formed using a RuSn target in an Ar gas atmosphere so as to have a thickness of 32.2 nm. The content ratio (atomic ratio) of the RuSn film was Ru:Sn=80:20. The crystal structure of the RuSn film was measured by an X-ray diffractometer (XRD), and the RuSn film had an amorphous structure.

The refractive index n and the extinction coefficient (refractive index imaginary part) k of the RuSn film of Example 13 formed as described above at the wavelength of 13.5 nm were as follows.

RuSn film: n=0.904, k=0.036

The relative reflectance of the phase shift film 4 made of the above-described RuSn film at the wavelength of 13.5 nm was 12.8% (absolute reflectance was 8.5%). Also, the thickness of the phase shift film 4 is 32.2 nm. This thickness is a thickness corresponding to a phase difference of 180 degrees when the phase shift film 4 is patterned. It was able to be about 50% thinner than 65 nm that is the thickness of the phase shift film 4 made of the TaN film in Comparative example 1 described later.

Next, under the same conditions as in Example 1 except that the dry etching gas of Example 1 was changed to $Cl_2$ gas, a reflective mask 200 was manufactured by using the above-described reflective mask blank 100. In the reflective mask 200 of Example 13, the $Cl_2$ gas was used because the phase shift film 4 was a RuSn material, the dry etching time was slightly longer as compared to that of Example 1 but workability was good, and the phase shift pattern 4a was able to be formed with high accuracy. In addition, the thickness of the phase shift pattern 4a was 32.2 nm, which was able to be thinner than the absorber film formed by the conventional Ta-based material, and the shadowing effect was able to be reduced compared to Comparative example 1.

Also, since the reflective mask 200 manufactured in Example 13 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 12.8% (absolute reflectance was 8.5%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 13.

Example 14

Example 14 is an example in which the material of the phase shift film 4 is changed to a RuSi film and the thickness is adjusted so as to have a phase difference of 180 degrees, and other than the above is the same as Example 1. That is, the phase shift film 4 made of a RuSi film was formed by a DC magnetron sputtering on a substrate with a multilayer reflective film on which the protective film 3 made of a $SiO_2$ film had been formed. The RuSi film was formed using a RuSi target in an Ar gas atmosphere so as to have a thickness of 34.1 nm. The content ratio (atomic ratio) of the RuSi film was Ru:Si=86:14. The crystal structure of the RuSi film was measured by an X-ray diffractometer (XRD), and the RuSi film had an amorphous structure.

The refractive index n and the extinction coefficient (refractive index imaginary part) k of the RuSi film of Example 14 formed as described above at the wavelength of 13.5 nm were as follows.

RuSi film: n=0.907, k=0.014

The relative reflectance of the phase shift film 4 made of the above-described RuSi film at the wavelength of 13.5 nm was 34.1% (absolute reflectance was 22.7%). Also, the thickness of the phase shift film 4 is 34.1 nm. This thickness is a thickness corresponding to a phase difference of 180 degrees when the phase shift film 4 is patterned. It was able to be about 48% thinner than 65 nm that is the thickness of the phase shift film 4 made of the TaN film in Comparative example 1 described later.

Next, under the same conditions as in Example 1 except that the dry etching gas of Example 1 was changed to $Cl_2$ gas, a reflective mask 200 was manufactured by using the above-described reflective mask blank 100. In the reflective mask 200 of Example 14, the $Cl_2$ gas was used because the phase shift film 4 was a RuSi material, the dry etching time was slightly longer as compared to that of Example 1 but workability was good, and the phase shift pattern 4a was able to be formed with high accuracy. In addition, the thickness of the phase shift pattern 4a was 34.1 nm, which was able to be thinner than the absorber film formed by the conventional Ta-based material, and the shadowing effect was able to be reduced compared to Comparative example 1.

Also, since the reflective mask 200 manufactured in Example 14 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 34.1% (absolute reflectance was 22.7%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 14.

Example 15

Example 15 is an example in which the material of the phase shift film 4 is changed to a RuTi film and the thickness is adjusted so as to have a phase difference of 180 degrees, and other than the above is the same as Example 1. That is, the phase shift film 4 made of a RuTi film was formed by a DC magnetron sputtering on a substrate with a multilayer reflective film on which the protective film 3 made of a $SiO_2$ film had been formed. The RuTi film was formed using a RuTi target in an Ar gas atmosphere so as to have a thickness of 45.7 nm. The content ratio (atomic ratio) of the RuTi film was Ru:Ti=40:60. The crystal structure of the RuTi film was measured by an X-ray diffractometer (XRD), and the RuTi film had an amorphous structure.

The refractive index n and the extinction coefficient (refractive index imaginary part) k of the RuTi film of Example 15 formed as described above at the wavelength of 13.5 nm were as follows.

RuTi film: n=0.930, k=0.015

The relative reflectance of the phase shift film 4 made of the above-described RuTi film at the wavelength of 13.5 nm was 29.0% (absolute reflectance was 19.3%). Also, the thickness of the phase shift film 4 is 45.7 nm. This thickness is a thickness corresponding to a phase difference of 180 degrees when the phase shift film 4 is patterned. It was able to be about 30% thinner than 65 nm that is the thickness of the phase shift film 4 made of the TaN film in Comparative example 1 described later.

Next, under the same conditions as in Example 1 except that the dry etching gas of Example 1 was changed to $Cl_2$ gas, a reflective mask 200 was manufactured by using the above-described reflective mask blank 100. In the reflective mask 200 of Example 15, the $Cl_2$ gas was used because the phase shift film 4 was a RuTi material, the dry etching time was slightly longer as compared to that of Example 1 but workability was good, and the phase shift pattern 4a was able to be formed with high accuracy. In addition, the thickness of the phase shift pattern 4a was 45.7 nm, which was able to be thinner than the absorber film formed by the conventional Ta-based material, and the shadowing effect was able to be reduced compared to Comparative example 1.

Also, since the reflective mask 200 manufactured in Example 15 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface was 29.0% (absolute reflectance was 19.3%), so that a sufficient phase shift effect was able to be obtained, and EUV exposure with high exposure margin and focus margin was able to be performed.

In the same manner as in the case of Example 1, a semiconductor device having desired characteristics was able to be manufactured using the reflective mask 200 manufactured in Example 15.

Example 16

Example 16 is an example in which the material of the phase shift film 4 is changed to a RuV film and the thickness is adjusted so as to have a phase difference of 180 degrees. The reflective mask blank 100 of Example 16 is the same as that of Example 1 except that, in the reflective mask blank 100 of Example 1, the protective film 3 was changed to a CrOC film and the phase shift film 4 made of a RuV film was formed.

That is, in Example 16, in the same manner as in Example 1, the back side conductive film 5 made of a CrN film was formed on the second main surface (back surface) of a $SiO_2$—$TiO_2$-based glass substrate 1, the multilayer reflective film 2 was formed on the main surface (the first main surface) of the substrate 1 at the opposite side, and the protective film 3 made of a CrOC film by a DC magnetron sputtering. The CrOC film was formed using a Cr target by reactive sputtering in a mixed gas atmosphere of an Ar gas, a $CO_2$ gas and a He gas so as to have a thickness of 2.5 nm. The content ratio (atomic ratio) of the CrOC film was Cr:O:C=71:15:14.

Next, on the protective film 3, the phase shift film 4 made of a RuV film was formed by a DC magnetron sputtering. The RuV film was formed using a RuV target in an Ar gas atmosphere so as to have a thickness of 33.0 nm. The content ratio (atomic ratio) of the RuV film was Ru:V=60:40. The crystal structure of the RuV film was measured by an X-ray diffractometer (XRD), and the RuV film had an amorphous structure.

The refractive index n and the extinction coefficient (refractive index imaginary part) k of the RuV film of Example 16 formed as described above at the wavelength of 13.5 nm were as follows.

RuV film: n=0.906, k=0.024

The relative reflectance of the phase shift film 4 made of the above-described RuV film at the wavelength of 13.5 nm was 21.1% (absolute reflectance was 14.1%). Also, the thickness of the phase shift film 4 is 33.0 nm. This thickness is a thickness corresponding to a phase difference of 180 degrees when the phase shift film 4 is patterned. It was able to be about 49% thinner than 65 nm that is the thickness of the phase shift film 4 made of the TaN film in Comparative example 1 described later.

Next, a reflective mask 200 was manufactured by using the above-described reflective mask blank 100.

First, a resist film 11 was formed on the phase shift film 4 of the reflective mask blank 100 with a thickness of 100 nm. Then, a desired pattern was drawn (exposure) on the resist film 11, and further developed and rinsed to form the predetermined resist pattern 11a. Next, using the resist pattern 11a as a mask, the RuV film (the phase shift film 4) was dry-etched using a mixed gas of a $CF_4$ gas and an $O_2$ gas (ratio of gas flow rates $CF_4$:$O_2$=1:1) to form the phase shift pattern 4a.

Thereafter, the resist pattern was removed by ashing, resist stripping liquid, or the like. Finally, wet cleaning using pure water (DIW) was performed to produce the reflective mask 200. If necessary, mask defect inspection can be performed after wet cleaning so that mask defects can be corrected appropriately.

In the reflective mask 200 of Example 16, because the phase shift film was a RuV material, workability with a fluorine-based gas was good, the phase shift pattern was able to be formed with high accuracy. In addition, the film thickness of the phase shift pattern was 33.0 nm, which was able to be thinner than the absorber film formed by the conventional Ta-based material.

Also, since the reflective mask 200 manufactured in Example 16 has small side wall roughness of the phase shift pattern 4a and a cross-sectional shape is stable, it had high transfer precision with little LER or dimensional in-plane variation of the transferred and formed resist pattern. In addition, as described above, the relative reflectance of the phase shift surface (reflectance with respect to the reflectance of the multilayer reflective film surface attached with a protective film) was 21.1% (absolute reflectance was 14.1%), so that a sufficient phase shift effect was able to be obtained, and EUV exposure with high exposure margin and focus margin was able to be performed.

The reflective mask 200 manufactured in Example 16 was set to an EUV scanner, and EUV exposure was performed on a wafer that is a semiconductor substrate on which a film to be processed and a resist film had been formed. Then, the exposed resist film was developed to form a resist pattern on the semiconductor substrate on which the film to be processed had been formed. This resist pattern was transferred to the film to be processed by etching, and through various steps such as formation of an insulating film and a conductive film, introduction of a dopant, annealing, and the like, a semiconductor device having desired characteristics was able to be manufactured.

Example 17

Example 17 is an example in which the relative reflectance of the phase shift film 4 was made to be 27% (absolute reflectance was 18%) and the thickness is adjusted so as to have a phase difference of 220 degrees, and other than the above is the same as Example 1 including the material (the RuCr film).

That is, in Example 17, the phase shift film 4 made of a RuCr film was formed by a DC magnetron sputtering on a substrate with a multilayer reflective film on which the protective film 3 made of a $SiO_2$ film had been formed. The RuCr film was formed using a RuCr target in an Ar gas atmosphere so as to have a thickness of 38.6 nm. The content ratio (atomic ratio) of the RuCr film was Ru:Cr=85:15. The crystal structure of the RuCr film was measured by an X-ray diffractometer (XRD), and the RuCr film had an amorphous structure.

The refractive index n and the extinction coefficient (refractive index imaginary part) k of the RuCr film of Example 17 formed as described above at the wavelength of 13.5 nm were as follows.

RuCr film: n=0.895, k=0.020

The relative reflectance of the phase shift film 4 made of the above-described RuCr film at the wavelength of 13.5 nm was 27% (absolute reflectance was 18%). Also, the thickness of the phase shift film 4 is 38.6 nm. This thickness is a thickness corresponding to a phase difference of 220 degrees when the phase shift film 4 is patterned. It was able to be about 41% thinner than 65 nm that is the thickness of the phase shift film 4 made of the TaN film in Comparative example 1 described later.

Next, under the same conditions as in Example 1, a reflective mask 200 was manufactured by using the above-described reflective mask blank 100. In addition, the thickness of the phase shift pattern 4a was 38.6 nm, which was able to be thinner than the absorber film formed by the conventional Ta-based material, and the shadowing effect was able to be reduced compared to Comparative example 1. Also, the contrast was improved 1.3 times as compared with the reflective mask manufactured by using the same material as in Example 17, and adjusted to have a relative reflectance of 27% (absolute reflectance was 18%) and a phase difference of 180 degrees.

In the same manner as in the case of Example 1, a semiconductor device having desired characteristics was able to be manufactured using the reflective mask 200 manufactured in Example 17.

Example 18

Example 18 is an example in which the relative reflectance of the phase shift film 4 is made to be 20% (absolute reflectance was 13.3%) and the thickness is adjusted so as to have a phase difference of 140 degrees, and other than the above is the same as Example 1 including the material (the RuCr film).

That is, in Example 18, the phase shift film 4 made of a RuCr film was formed by a DC magnetron sputtering on a substrate with a multilayer reflective film on which the protective film 3 made of a $SiO_2$ film had been formed. The RuCr film was formed using a RuCr target in an Ar gas atmosphere so as to have a thickness of 30.4 nm. The content ratio (atomic ratio) of the RuCr film was Ru:Cr=66:34. The crystal structure of the RuCr film was measured by an X-ray diffractometer (XRD), and the RuCr film had an amorphous structure.

The refractive index n and the extinction coefficient (refractive index imaginary part) k of the RuCr film of Example 18 formed as described above at the wavelength of 13.5 nm were as follows.

RuCr film: n=0.916, k=0.031

The relative reflectance of the phase shift film 4 made of the above-described RuCr film at the wavelength of 13.5 nm was 20% (absolute reflectance was 13.3%). Also, the thickness of the phase shift film 4 is 30.4 nm. This thickness is a thickness corresponding to a phase difference of 140 degrees when the phase shift film 4 is patterned. It was able to be about 53% thinner than 65 nm that is the thickness of the phase shift film 4 made of the TaN film in Comparative example 1 described later.

Next, under the same conditions as in Example 1, a reflective mask 200 was manufactured by using the above-described reflective mask blank 100. In addition, the thickness of the phase shift pattern 4a was 30.4 nm, which was able to be thinner than the absorber film formed by the conventional Ta-based material, and the shadowing effect was able to be reduced compared to Comparative example 1. Also, the contrast was improved 1.5 times as compared with the reflective mask manufactured by using the same material as in Example 18, and adjusted to have a relative reflectance of 20% (absolute reflectance was 13.3%) and a phase difference of 180 degrees.

In the same manner as in the case of Example 1, a semiconductor device having desired characteristics was able to be manufactured using the reflective mask 200 manufactured in Example 18.

Example 19

Example 19 is an example in which the film thickness of the protective film is changed, the material of the phase shift film 4 is changed to a RuCrN film and the thickness is adjusted to have a phase difference of 180 degrees, and other than the above is the same as Example 1.

That is, in Example 19, the phase shift film 4 made of a RuCrN film was formed by a DC magnetron sputtering on a substrate with a multilayer reflective film on which the protective film 3 made of a $SiO_2$ film having a thickness of 3.2 nm has been formed. The RuCrN film was formed using a Ru target and Cr target in an Ar gas and $N_2$ gas atmosphere so as to have a thickness of 34.6 nm. The content ratio (atomic ratio) of the RuCrN film was Ru:Cr:N=55:38:7. The crystal structure of the RuCrN film was measured by an X-ray diffractometer (XRD), and the RuCrN film had an amorphous structure.

The refractive index n and the extinction coefficient (refractive index imaginary part) k of the RuCrN film of Example 19 formed as described above at the wavelength of 13.5 nm were as follows.

RuCr film: n=0.905, k=0.025

The relative reflectance of the phase shift film 4 made of the above-described RuCrN film at the wavelength of 13.5 nm was 16% (absolute reflectance was 10.7%). Also, the thickness of the phase shift film 4 is 34.6 nm. This thickness is a thickness corresponding to a phase difference of 180 degrees when the phase shift film 4 is patterned. It was able to be about 47% thinner than 65 nm that is the thickness of the phase shift film 4 made of the TaN film in Comparative example 1 described later.

Next, under the same conditions as in Example 1, a reflective mask 200 was manufactured by using the above-described reflective mask blank 100. In addition, the thickness of the phase shift pattern 4a was 34.6 nm, which was able to be thinner than the absorber film formed by the conventional Ta-based material, and the shadowing effect was able to be reduced compared to Comparative example 1.

In the same manner as in the case of Example 1, a semiconductor device having desired characteristics was able to be manufactured using the reflective mask 200 manufactured in Example 19.

Comparative Example 1

In Comparative example 1, the reflective mask blank 100 and the reflective mask 200 were manufactured in the same structure and method as in Example 1 except that a Ru film was used as the protective film 3 and a single layer TaN film was used as the phase shift film 4, and a semiconductor device was manufactured in the same manner as in Example 1.

The Ru film (the protective film 3) was formed on the multilayer reflective film 2 of the mask blank structure of Example 1. This Ru film was formed by ion beam sputtering using Ru as a target in an Ar gas atmosphere to have a thickness of 2.5 nm. The single layer TaN film was formed on the Ru film. The forming method of the TaN film is that the TaN film was formed by reactive sputtering using Ta as a target in a mixed gas atmosphere of a Xe gas and a $N_2$ gas. The thickness of the TaN film is 65 nm, and the element ratio of the film is 88 atomic % for Ta and 12 atomic % for N.

The refractive index n and the extinction coefficient (refractive index imaginary part) k of the TaN film formed as described above at the wavelength of 13.5 nm were as follows.

TaN film: n=0.949, k=0.032

The phase difference of the phase shift film 4 made of the above-described single-layer TaN film at a wavelength of 13.5 nm is 180 degrees. The relative reflectance to the surface of the multilayer reflective film 2 was 1.7%. In addition, the absolute reflectance of the phase shift film 4 was 1.1%.

Thereafter, in the same manner as in Example 1, a resist film 11 was formed on the phase shift film 4 of a single-layer TaN film, and desired pattern drawing (exposure), development and rinsing were performed to form a resist pattern 11a. Then, using the resist pattern 11a as a mask, the phase shift film 4 of a TaN single-layer film was dry etched using a chlorine gas to form a phase shift pattern 4a. Removal of the resist pattern 11a, cleaning of the mask, or the like are performed in the same manner as in Example 1 to manufacture the reflective mask 200.

The thickness of the phase shift pattern 4a was 65 nm and the shadowing effect was not able to be reduced. In addition, as described above, the relative reflectance of the phase shift surface was 1.7% (absolute reflectance was 1.1%), so that a sufficient phase shift effect was not able to be obtained and EUV exposure with high exposure margin and high focus margin was not able to be performed.

As described above, the total film thickness of the phase shift films 4 of Examples 1 to 19 was able to be made thinner about 30% or more than the film thickness of 65 nm of the phase shift film 4 of Comparative example 1. Therefore, it is clear that the reflective masks 200 of Examples 1 to 19 can reduce the shadowing effect.

BRIEF DESCRIPTION OF THE REFERENCE SYMBOLS

1 Substrate
2 Multilayer reflective film
3 Protective film
4 Phase shift film
4a Phase shift pattern
5 Back side conductive film
11 Resist film
11a Resist pattern
100 Reflective mask blank
200 Reflective mask

The invention claimed is:

1. A reflective mask blank comprising:
a substrate;
a multilayer reflective film on the substrate; and
a phase shift film on the multilayer reflective film,
wherein the phase shift film comprises ruthenium (Ru) and at least one selected from cobalt (Co), titanium (Ti), niobium (Nb), molybdenum (Mo) and rhenium (Re),
when the phase shift film comprises Co, a composition ratio of the Ru and the Co (Ru:Co) is 20:1 to 1:5,
when the phase shift film comprises Ti, a composition ratio of the Ru and the Ti (Ru:Ti) is 20:1 to 1:20,
when the phase shift film comprises Nb, a composition ratio of the Ru and the Nb (Ru:Nb) is 20:1 to 5:1,
when the phase shift film comprises Mo, a composition ratio of the Ru and the Mo (Ru:Mo) is 20:1 to 4:1, and
when the phase shift film comprises Re, a composition ratio of the Ru and the Re (Ru:Re) is 20:1 to 1:20.

2. The reflective mask blank according to claim 1, wherein the crystal structure of the phase shift film is amorphous.

3. The reflective mask blank according to claim 1, wherein a refractive index n of the phase shift film is 0.860 to 0.950 and an extinction coefficient k of the phase shift film is 0.008 to 0.095.

4. The reflective mask blank according to claim 1, wherein a relative reflectance of the phase shift film is 6% to 40%.

5. The reflective mask blank according to claim 1, wherein a phase difference of the phase shift film is 130 degrees to 230 degrees.

6. The reflective mask blank according to claim 1, wherein, when the phase shift film comprises Co, a thickness of the phase shift film is 40 nm or less.

7. The reflective mask blank according to claim 1, wherein, when the phase shift film comprises Ti, a thickness of the phase shift film is 66 nm or less.

8. The reflective mask blank according to claim 1, wherein, when the phase shift film comprises Nb, a thickness of the phase shift film is 32 nm or less.

9. The reflective mask blank according to claim 1, wherein, when the phase shift film comprises Mo, a thickness of the phase shift film is 33 nm or less.

10. The reflective mask blank according to claim 1, wherein, when the phase shift film comprises Re, a thickness of the phase shift film is 38 nm or less.

11. A reflective mask comprising:
a substrate;
a multilayer reflective film on the substrate; and
a phase shift film with a pattern on the multilayer reflective film, wherein
the phase shift film comprises ruthenium (Ru) and at least one selected from cobalt (Co), titanium (Ti), niobium (Nb), molybdenum (Mo) and rhenium (Re),
when the phase shift film comprises Co, a composition ratio of the Ru and the Co (Ru:Co) is 20:1 to 1:5,
when the phase shift film comprises Ti, a composition ratio of the Ru and the Ti (Ru:Ti) is 20:1 to 1:20,
when the phase shift film comprises Nb, a composition ratio of the Ru and the Nb (Ru:Nb) is 20:1 to 5:1, when the phase shift film comprises Mo, a composition ratio of the Ru and the Mo (Ru:Mo) is 20:1 to 4:1, and when the phase shift film comprises Re, a composition ratio of the Ru and the Re (Ru:Re) is 20:1 to 1:20.

12. A method of manufacturing a semiconductor device, the method comprising placing the reflective mask according to claim 11 in an exposure apparatus comprising an exposure light source that emits EUV light, and transferring a transfer pattern to a resist film formed on a transferred substrate.

13. The reflective mask according to claim 11, wherein the crystal structure of the phase shift film is amorphous.

14. The reflective mask according to claim 11, wherein a refractive index n of the phase shift film is 0.860 to 0.950 and an extinction coefficient k of the phase shift film is 0.008 to 0.095.

15. The reflective mask according to claim 11, wherein a relative reflectance of the phase shift film is 6% to 40%.

16. The reflective mask according to claim 11, wherein a phase difference of the phase shift film is 130 degrees to 230 degrees.

17. The reflective mask according to claim 11, wherein, when the phase shift film comprises Co, a thickness of the phase shift film is 40 nm or less.

18. The reflective mask according to claim 11, wherein, when the phase shift film comprises Ti, a thickness of the phase shift film is 66 nm or less.

19. The reflective mask according to claim 11, wherein, when the phase shift film comprises Nb, a thickness of the phase shift film is 32 nm or less.

20. The reflective mask according to claim 11, wherein, when the phase shift film comprises Mo, a thickness of the phase shift film is 33 nm or less.

21. The reflective mask according to claim 11, wherein, when the phase shift film comprises Re, a thickness of the phase shift film is 38 nm or less.

* * * * *